US011043335B2

United States Patent
Wheeler et al.

(10) Patent No.: US 11,043,335 B2
(45) Date of Patent: Jun. 22, 2021

(54) MULTILAYER CARBON NANOTUBE FILM-CONTAINING DEVICES

(71) Applicant: Alliance for Sustainable Energy, LLC, Golden, CO (US)

(72) Inventors: Lance Michael Wheeler, Wheat Ridge, CO (US); Rachelle Rosemarie Ihly, Parker, CO (US); Noah James Stanton, Denver, CO (US); Jeffrey Lee Blackburn, Golden, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 15/976,108

(22) Filed: May 10, 2018

(65) Prior Publication Data

US 2018/0330891 A1    Nov. 15, 2018

Related U.S. Application Data

(60) Provisional application No. 62/504,109, filed on May 10, 2017.

(51) Int. Cl.
| | | |
|---|---|---|
| *H01L 31/044* | (2014.01) | |
| *H01G 9/20* | (2006.01) | |
| *H01L 51/42* | (2006.01) | |
| *H01L 51/00* | (2006.01) | |

(Continued)

(52) U.S. Cl.
CPC ............ *H01G 9/2063* (2013.01); *E06B 9/24* (2013.01); *H01L 51/0035* (2013.01); *H01L 51/0036* (2013.01); *H01L 51/0043* (2013.01); *H01L 51/4226* (2013.01); *H01L 51/4253* (2013.01); *E06B 2009/2417* (2013.01);

(Continued)

(58) Field of Classification Search
CPC . H01G 9/2063; E06B 9/24; E06B 2009/2417; E06B 2009/2476; H01L 51/0036; H01L 51/0043; H01L 51/0048; H01L 51/4253; H01L 51/0035
See application file for complete search history.

(56) References Cited

U.S. PATENT DOCUMENTS

| | | |
|---|---|---|
| 3,507,563 A | 4/1970 | Berman et al. |
| 6,084,702 A | 7/2000 | Byker et al. |
| 7,660,029 B2 | 2/2010 | Ashrit et al. |

(Continued)

FOREIGN PATENT DOCUMENTS

| | | | |
|---|---|---|---|
| CN | 102449795 | * | 5/2012 |
| WO | 2016123407 A1 | | 8/2016 |

OTHER PUBLICATIONS

Momblona et al. "Efficient vacuum deposited p-i-n and n-i-p perovskite solar cells employing doped charge transport layers." Energy Environ. Sci., 2016, 9, 3456. (Year: 2016).*

(Continued)

*Primary Examiner* — Bach T Dinh
(74) *Attorney, Agent, or Firm* — Michael A. McIntyre

(57) ABSTRACT

The present disclosure relates to a device that includes an active layer and a first charge transport layer, where the first charge transport layer includes a first layer and a second layer, the first layer is in contact with the second layer, the second layer is positioned between the first layer and the active layer, the first layer comprises a first carbon nanostructure, and the second layer includes a second carbon nanostructure.

27 Claims, 24 Drawing Sheets

(51) Int. Cl.
   E06B 9/24      (2006.01)
   H01L 51/44     (2006.01)
(52) U.S. Cl.
   CPC ... E06B 2009/2476 (2013.01); H01L 51/0048
                    (2013.01); H01L 51/445 (2013.01)

(56) References Cited

U.S. PATENT DOCUMENTS

| | | | |
|---|---|---|---|
| 7,737,356 | B2 | 6/2010 | Goldstein |
| 8,154,029 | B2 | 4/2012 | Millett et al. |
| 8,431,045 | B2 | 4/2013 | Byker et al. |
| 9,116,409 | B1 | 8/2015 | Sun et al. |
| 10,388,897 | B2 | 8/2019 | Snaith et al. |
| 2006/0172135 | A1 | 8/2006 | Agrawal et al. |
| 2008/0092456 | A1 | 4/2008 | Millett et al. |
| 2009/0283728 | A1 | 11/2009 | Byker et al. |
| 2010/0051968 | A1 | 3/2010 | Seo et al. |
| 2010/0132770 | A1 | 6/2010 | Beatty et al. |
| 2011/0249314 | A1 | 10/2011 | Wang et al. |
| 2012/0029258 | A1 | 11/2012 | Byker et al. |
| 2013/0003157 | A1 | 1/2013 | Wang et al. |
| 2013/0330559 | A1* | 12/2013 | Hellstrom ........... G06F 17/5009 428/408 |
| 2014/0176615 | A1 | 6/2014 | Avci et al. |
| 2014/0327952 | A1 | 11/2014 | Anderson et al. |
| 2015/0122314 | A1 | 5/2015 | Snaith et al. |
| 2015/0129034 | A1 | 5/2015 | Snaith et al. |
| 2015/0206663 | A1* | 7/2015 | Wijdekop ........... H01L 51/0024 136/256 |
| 2015/0228918 | A1* | 8/2015 | Hiraoka ................ B82Y 30/00 136/255 |
| 2015/0243444 | A1 | 8/2015 | Irwin et al. |
| 2016/0139476 | A1 | 5/2016 | Garcia et al. |
| 2017/0089128 | A1 | 3/2017 | Wheeler |
| 2017/0179019 | A1 | 6/2017 | Alur et al. |
| 2017/0256364 | A1 | 9/2017 | Yamamoto et al. |
| 2018/0059440 | A1 | 3/2018 | Yu et al. |
| 2018/0252028 | A1 | 9/2018 | Wheeler et al. |

OTHER PUBLICATIONS

Ihly et al. "Efficient charge extraction and slow recombination in organic-inorganic perovskites capped with semiconducting single-walled carbon nanotubes." Energy Environ. Sci., 2016, 9, 1439. (Year: 2016).*

Lei, T., Chen, X., Pitner, G., Wong, H. S., Bao, Z., Removable and Recyclable Conjugated Polymers for Highly Selective and High-Yield Dispersion and Release of Low-Cost Carbon Nanotubes, Journal of the American Chemical Society, 2016, 138, 802-805 (Year: 2016).*

Halder et al., Exploring Thermochromi Behavior of Hydrated Hybrid Perovskites in Solar Cells, J. Phys. Chem. Lett., 2015, 6, 3180-3184 (Year: 2015).*

Bryant et al., A Transparent Conductive Adhesive Laminate Electrode for High-Efficiency Organic-Inorganic Lead Halide Perovskite Solar Cells, Adv. Mater., 2014, 26, 7499-7504 (Year: 2014).*

Leguy et. al. Reversible Hydration of CH3NH3PbI3 in Films, Single Crystals, and Solar Cells, Chem. Mater., 2015, 27, 3397-3407. (Year: 2015).*

Bhatia et al. Functionalized Carbon Nanotube Doping of P3HT:PCBM Photovoltaic Devices for Enhancing Short Circuit Current and Efficiency, J. Saudi Chemical Society, 2017, 21, 366-376, published Nov. 17, 2016 (Year: 2016).*

Arima et al., "Variation of optical gaps in perovskite-type 3d transition-metal oxides," Physical Review B, vol. 48, No. 23, Dec. 15, 1993-I, pp. 17 006-17 009.

Beal et al., "Cesium Lead Halide Perovskites with Improved Stability for Tandem Solar Cells," The Journal of Physical Chemistry Letters, vol. 7, 2016, pp. 746-751.

Bryant et al., "A Transparent Conductive Adhesive Laminate Electrode for High-Efficiency Organic-Inorganic Lead Halide Perovskite Solar Cells," Advanced Materials, vol. 26, 2014, pp. 7499-7504.

Cannavale et al., "Forthcoming perspectives of photoelectrochromic devices: a critical review," Energy Environ. Sci., 2016, vol. 9, pp. 2682-2719.

Cottingham et al., "Compositionally Dependent Phase Identity of Colloidal $CsPbBr_3$-xIx Quantum Dots," Chemistry of Materials, vol. 28, 2016, pp. 7574-7577.

Davy et al., "Pairing of near-ultraviolet solar cells with electrochromic windows for smart management of the solar spectrum," Nature Energy, vol. 2, 2017, pp. 17104-17110.

Eperon et al., "Neutral Color Semitransparent Microstructured Perovskite Solar Cells," ACS Nano, 2014, vol. 8, No. 1, pp. 591-598.

Gao et al., "Organohalide lead perovskites for photovoltaic applications," Energy & Environmental Science, vol. 7, 2014, pp. 2448-2463.

Gorgolis et al., "Solar energy materials for glazing technologies," Solar Energy Materials & Solar Cells, vol. 144, 2016, pp. 559-578.

Granqvist, C.G., "Electrochromic devices," Journal of the European Ceramic Society, vol. 25, Issue 12, 2005, pp. 1-13.

Habisreutinger et al., "Carbon Nanotube/Polymer Composites as a Highly Stable Hole Collection Layer in Perovskite Solar Cells," Nano Letters, vol. 14, 2014, pp. 5561-5568.

Habisreutinger et al., "Dopant-Free Planar n-i-p Perovskite Solar Cells with Steady-State Efficiencies Exceeding 18%," ACS Energy Letters, vol. 2, 2017, pp. 622-628.

Halder et al., "Exploring Thermochromic Behavior of Hydrated Hybrid Perovskites in Solar Cells," American Chemical Society, Journal of Physical Chemistry Letters, vol. 6, 2015, pp. 3180-3184.

Heo et al., "Flexible Reflective Color Displays using Thermochromic Pigments," Journal of the Optical Society of Korea, vol. 17, No. 5, Oct. 2013, pp. 428-432.

Hao et al., "Lead-free solid-state organic-inorganic halide perovskite solar cells," Nature Photonics, vol. 8, Jun. 2014, pp. 489-494.

Huang et al., "Direct Observation of Reversible Transformation of $CH_3NH_3PbI_3$ and $NH_4PbI_3$ Induced by Polar Gaseous Molecules," Journal of Physical Chemistry Letters, 2016, vol. 7, pp. 5068-5073.

Idigoras et al., "The interaction between hybrid organic-inorganic halide perovskite and selective contacts in perovskite solar cells: an infrared spectroscopy study," Phys. Chem. Chem. Phys., vol. 18, 2016, pp. 13583-13590.

Jeon et al., "Compositional engineering of perovskite materials for high-performance solar cells," Nature/Letter, vol. 517, Jan. 22, 2015, pp. 476-480.

Kuroiwa et al., "Heat-Set Gel-like Networks of Lipophilic Co(II) Triazole Complexes in Organic Media and Their Thermochromic Structural Transitions," Journal of American Chemical Society, vol. 126, No. 7, 2004, pp. 2016-2021.

Lau et al., "$CsPbBr_2$ Perovskite Solar Cell by Spray-Assisted Deposition," ACS Energy Letters, vol. 1, 2016, pp. 573-577.

Leguy et al., "Reversible Hydration of $CH_3NH_3PbI_3$ in Films, Single Crystals, and Solar Cells," Chemistry of Materials, 2015, 11 pages.

Li et al., "Correlated Perovskites as a New Platform for Super-Broadband-Tunable Photonics," Advanced Materials, vol. 28, Issue 41, Nov. 2, 2016, 9 pages.

Mitzi et al., "Organic-Inorganic Electronics," IBM Journal of Research and Development, vol. 45, No. 1, Jan. 2001, pp. 29-45.

NREL Energy Innovation Portal, "Design and Fabrication of Thermochromic Energy-Harvesting Windows," http://techportal.eere.energy.gov/technology.do/techID=1373, accessed Apr. 18, 2018, 2 pages.

Nenon et al., "Structural and chemical evolution of methylammonium lead halide perovskites during thermal processing from solution," Energy & Environmental Science, vol. 9, 2016, pp. 2072-2082.

Noel et al., "A low viscosity, low boiling point, clean solvent system for the rapid crystallisation of highly specular perovskite films," Energy & Environmental Science, vol. 10, 2017, pp. 145-152.

(56) References Cited

OTHER PUBLICATIONS

Norton-Baker et al., "Polymer-Free Carbon Nanotube Thermoelectrics with Improved Charged Carrier Transport and Power Factor," ACS Energy Letters, 2016, vol. 1, 2016, pp. 1212-1220.
Ouyang et al., "Conducting Polymer as Transparent Electric Glue," Advanced Materials, vol. 18, 2006, pp. 2141-2144.
Pang et al., "Transformative Evolution of Organolead Triiodide Perovskite Thin Films from Strong Room-Temperature Solid-Gas Interaction between $HPbI_3$—$CH_3NH_2$ Precursor Pair," Journal of the American Chemical Society, vol. 138, 2016, pp. 750-753.
Passerini et al., "The Intercalation of Lithium in Nickel Oxide and Its Electrochromic Properties," Journal of Electrochemical Society, vol. 137, No. 10, Oct. 1990, pp. 3297-3300.
Pfeiffer et al., "Controlled doping of phthalocyanine layers by cosublimation with acceptor molecules: A systematic Seebeck and conductivity study," Applied Physics Letters, vol. 73, No. 22, Nov. 30, 1998, pp. 3202-3204.
Piccolo et al., "Performance requirements for electrochromic smart window," Journal of Building Engineering, 2015, vol. 3, pp. 94-103.
Raw et al., "Syntheses and structure of hydrothermally prepared $CsNiX3$ (X-Cl, Br, I)," Journal of Solid State Chemistry, vol. 192, 2012, pp. 34-37.
Schubert et al., "Solid-State Light Sources Getting Smart," Science, 2005, vol. 308, 6 pages.
Sharma et al., "Phase Diagrams of Quasibinary Systems of the Type: $ABX_3$—$A'BX_3$; $AB'X_3$—$AB'X_3$, and $ABX_3$—$ABX'_3$; X=Halogen," Zeitschrift für Physikalische Chemie, 1992, pp. 63-80.
Sun et al., "Influence of water on the electrochemical properties of $(CeO_2)x(TiO_2)1-x$ and $WO_3$ sol-gel coatings and electrochromic devices," Solid State Ionics, vol. 165, 2003, pp. 181-189.
Tanaka et al., "Bandgap and exciton binding energies in lead-iodide-based natural quantum-well crystals," Science and Technology of Advanced Materials, vol. 4, 2003, pp. 599-604.
Treml et al., "Quantitative Framework for Evaluating Semitransparent Photovoltaic Windows," ACS Energy Letters, vol. 1, 2016, pp. 391-394.
Wittwer et al., "Gasochromic windows," Solar Energy Materials and Solar Cells, vol. 84, Issues 1-4, Oct. 2004, pp. 305-314.
Yangui et al., "Rapid and robust spatiotemporal dynamics of the first-order phase transition in crystals of the organic-inorganic perovskite $(C_{12}H_{25}NH_3)2PbI_4$," Scientific Reports, 5:16634, pp. 1-10.
You et al., "Low-Temperature Solution-Processed Perovskite Solar Cells with High Efficiency and Flexibility," ACS Nano, vol. 8, No. 2, 2014, pp. 1674-1680.
Yuan et al., "Electric-Field-Driven Reversible Conversion Between Methylammonium Lead Triiodide Perovskites and Lead Iodide at Elevated Temperatures," Advanced Materials Views, 2016, vol. 6, 7 pages.
Zhao et al., "Optical bleaching of perovskite $(CH_3NH_3)PbI_3$ through room-temperature phase transformation induced by ammonia," The Royal Society of Chemistry, Chemical Communication, vol. 50, 2014, pp. 1605-1607.
Zong et al., "Thin-Film Transformation of $NH_4PbI_3$ to $CH_3NH_3PbI_3$ Perovskite: A Methylamine-Induced Conversion-Healing Process," Angewandte Chemie International Edition, vol. 55, 2016, pp. 14723-14727.
PCT/US16/54188 Search Report and Written Opinion dated Dec. 13, 2016.
PCT/US18/19972 Search Report and Written Opinion dated May 30, 2018.
PCT/US18/32088 Search Report and Written Opinion dated Jul. 12, 2018.
Search Report from corresponding PCT patent application No. PCT/US18/67435 dated Mar. 27, 2019, 3 pages.
Written Opinion from corresponding PCT patent application No. PCT/US18/67435 dated Mar. 27, 2019, 6 pages.
Li et al., "Stabilizing Perovskite Structures by Tuning Tolerance Factor: Formation of Formamidinium and Cesium Lead Iodide Solid-State Alloys," ACS Chemistry of Materials, vol. 28, 2016, pp. 284-292.
Kitazawa et al., "Optical properties of $Ch_3Nh_3PbX_3$ (X=halogen) and their mixed-halide crystals," Journal of Materials Science, vol. 37, No. 17, Dec. 1, 2002, pp. 3585-3587.
EP 16 85 2492 Supplementary Partial European Search Report dated Apr. 3, 2019, 13 pages.
Frolova, L. et al., "Highly Efficient All-Inorganic Planar Heterojunction Perovskite Solar Cells Produced by Thermal Coevaporation of CsI and PbI2 ," Journal of Physical Chemistry Letters, vol. 8, 2017, pp. 67-72.
Ahmad, M. et al., "Structural, electronic and optical properties of $CsPbX3$ (X=Cl, Br, I) for energy storage and hybrid solar cell applications," Journal of Alloys and Compounds, vol. 705, 2017, pp. 828-839.
Goldschmidt, J., "From window to solar cell and back," Nature Materials, vol. 17, Mar. 2018, pp. 210-220.
Lin, J. et al., "Thermochromimc halide perovskite solar cells," Nature Materials, vol. 17, Mar. 2018, pp. 261-267.
Zhou, Z. et al., "Methylamine-Gas-Induced Defect Healing Behavior of CH3NH3PbI3 Thin Films for Perovskite Solar Cells," Angewandte Chemie, International Edition, vol. 54, 2015, 5 pages.
Button, R. et al., "Bandgap-Tunable Cesium Lead Halide Perovskites with High Thermal Stability for Efficient Solar Cells," Advanced Energy Materials, vol. 6, 2016, 6 pages.
EP 18757526.1 Extended Search Report dated Nov. 6, 2020, 10 pages.
Long, R. et al., "Strong Interaction at the Perovskite/TiO2 Inbterface Facilitates Ultrafast Photoinduced Charge Separation: A Nonadiabatic Molecular Dynamics Study," Journal of Physical Chemistry C, vol. 121, 2017, 10 pages.

\* cited by examiner

MULTILAYER CARBON NANOTUBE FILM-CONTAINING DEVICES

CROSS-REFERENCE TO RELATED APPLICATIONS

This application claims the benefit of U.S. Provisional Patent Application No. 62/504,109 filed May 10, 2017, the contents of which are incorporated herein by reference in their entirety.

CONTRACTUAL ORIGIN

The United States Government has rights in this disclosure under Contract No. DE-AC36-08GO28308 between the United States Department of Energy and Alliance for Sustainable Energy, LLC, the Manager and Operator of the National Renewable Energy Laboratory.

BACKGROUND

The cost of conventional photovoltaics based on silicon modules is now competitive with non-renewable energy sources. Next-generation photovoltaic technologies must offer significantly lower costs or high-value functional properties to extend beyond the current residential rooftop and large-area solar farm markets. Building-integrated photovoltaics—where photovoltaic panels replace conventional building materials such as the roofs, windows, or façades—offer one such alternative pathway to increased solar energy penetration.

SUMMARY

An aspect of the present disclosure is a device that includes an active layer and a first charge transport layer, where the first charge transport layer includes a first layer and a second layer, the first layer is in contact with the second layer, the second layer is positioned between the first layer and the active layer, the first layer comprises a first carbon nanostructure, and the second layer includes a second carbon nanostructure.

In some embodiments of the present disclosure, the first carbon nanotube may include a first single-walled carbon nanotube (SWCNT). In some embodiments of the present disclosure, the first SWCNT may further include a dopant. In some embodiments of the present disclosure, the dopant may include at least one of triethyloxonium hexachloroantimonate, 2,3,5,6-tetrafluoro-7,7,8,8-tetracyanoquinodimethane, a phosphine, an alkyl crown ether complex, an amine, nitrogen, and/or boron. In some embodiments of the present disclosure, the dopant may be present at an atomic concentration between greater than 0% and 30%. In some embodiments of the present disclosure, the first layer may have a thickness between one nanometer and 200 nm, inclusively. In some embodiments of the present disclosure, the first SWCNT may be at least partially semiconductive and/or partially metallic.

In some embodiments of the present disclosure, the second carbon nanostructure may include a second SWCNT. In some embodiments of the present disclosure, the second SWCNT is not doped. In some embodiments of the present disclosure, the second carbon nanostructure may further include a polymer where the second carbon nanostructure may be at least partially coated by the polymer. In some embodiments of the present disclosure, the polymer may include at least one of poly[(9,9-dioctylfluorenyl-2,7-diyl)-alt-co-(6,6'-{2,2'-bipyridine})], poly[(9,9-dihexylfluorenyl-2,7-diyl)-co-(9,10-anthracene)], poly(9,9-dioctylfluorenyl-2,7-diyl), poly[2-ureido-6[1H]-pyrimidinone], poly[(9,9-di-n-dodecyl-2,7-fluorendiyl-dimethine)-(1,4-phenylene-dinitrilomethine)], and/or poly(3-hexylthiophene-2,5-diyl) (P3HT). In some embodiments of the present disclosure, the polymer may be present at a mass ratio of the polymer to the second carbon nanostructure between 0.1:1 and 1:1, inclusively. In some embodiments of the present disclosure, the second layer may have a thickness between greater than one nanometer and 200 nm, inclusively. In some embodiments of the present disclosure, the second SWCNT may be at least partially semiconductive and/or partially metallic.

In some embodiments of the present disclosure, the first layer and the second layer are permeable to an intercalating molecule. In some embodiments of the present disclosure, the intercalating molecule may include $CH_3NH_2$. In some embodiments of the present disclosure, the first layer and the second layer are capable of transmitting light.

In some embodiments of the present disclosure, the first carbon nanostructure may include a first single-walled carbon nanotube (SWCNT) that is doped with 2,3,5,6-tetrafluoro-7,7,8,8-tetracyanoquinodimethane ($F_4TCNQ$), the $F_4TCNQ$ may be present at an atomic concentration between greater than 0% and 30%, the second carbon nanostructure may include a second SWCNT at least partially coated with poly(3-hexylthiophene-2,5-diyl) (P3HT), the P3HT may be present at a mass ratio of the P3HT to the second SWCNT between 0.1:1 and 1:1, inclusively, and the first layer and the second layer may have a combined thickness between 1 nanometer and 200 nanometers. In some embodiments of the present disclosure, the active layer may include at least one of an inorganic semiconductor material, an organic-inorganic semiconductor material, and/or an organic semiconductor material.

An aspect of the present disclosure is a method for reversibly switching a window integrated photovoltaic device between a first state and a second state, where the method includes a first reversible transferring of a molecule from a reservoir through at least a charge transport layer to an active layer, intercalating the molecule in the active layer, decalating the molecule from the active layer, and a second reversible transferring of the molecule through at least the charge transport layer to the reservoir. Further, the first reversible transferring results in the first state, while in the first state, the active layer is substantially transparent to visible light, the second reversible transferring results in the second state, while in the second state, the active layer is substantially opaque to visible light, and while in the first state and the second state, the device is capable of converting at least a portion of light to electricity.

In some embodiments of the present disclosure, the charge transport layer may include a first layer and a second layer, the first layer may be in contact with the second layer, the second layer may be positioned between the first layer and the active layer, the first layer may include a first carbon nanostructure, the second layer may include a second carbon nanostructure, and the charge transport layer may be positioned between the active layer and the reservoir.

BRIEF DESCRIPTION OF THE DRAWINGS

Exemplary embodiments are illustrated in referenced figures of the drawings. It is intended that the embodiments and figures disclosed herein are to be considered illustrative rather than limiting.

FIG. 4A illustrates power conversion efficiency as a function of visible transmittance illustrates the fundamental trade-off for semitransparent WIPV using static absorbers. The lower, right marker (marked UV), indicates the maximum theoretical PCE of a PV device converting only UV light, and the marker labeled IR indicates the maximum PCE of a PV device that converts only IR light. The remaining markers are calculated from the theoretical maximum for a 1.5 eV bandgap methylammonium lead iodide (MAPI) perovskite of varying absorber thicknesses. FIG. 4B illustrates AM1.5 solar spectral irradiance as a function of solar photon energy (the outer boundary). The internal spectra correspond to different wavelengths of light with the arrow indicating increasing wavelengths. S-Q is the Shockley-Queisser limit of an absorber layer thick enough to have unity absorption of photons with energy at or above the absorber bandgap.

FIG. 4C illustrates the intercalation/de-intercalation mechanism behind the photothermal switching of mixed-halide perovskite (MHP) WIPV devices.

FIG. 8A illustrates a PV device architecture, according to some embodiments of the present disclosure. FIG. 8B illustrates an SEM cross-section image of the device showing the layers beneath the nickel grid coated with PEDDOT:PSS$^{D-Sorbitol}$, according to some embodiments of the present disclosure. The scale bar is 200 nm. FIG. 8C illustrates a photograph of a device with three complete pixels highlighted with dashed white lines, according to some embodiments of the present disclosure. FIG. 8D illustrates an SEM image highlighting the nickel grid top contact, according to some embodiments of the present disclosure. The scale bar is 300 µm. FIG. 8E illustrates an SEM image of nickel grid coat (white lines) coated with PEDDOT:PSS$^{D-Sorbitol}$ laminated onto the SWCNT$^{F4TCNQ}$ layer, according to some embodiments of the present disclosure. Excess PEDDOT:PSS$^{D-Sorbitol}$ is visible along the grid. The scale bar is 50 µm. FIG. 8F illustrates an SEM image showing the porous network of SWCNT$^{F4TCNQ}$ that allows gas to permeate through to the $CH_3NH_3PbI_3$ layer for switching, according to some embodiments of the present disclosure. FIG. 8G illustrates the transmittance of a device in the transparent (indicated as "bleached") and colored states as a function of wavelength, according to some embodiments of the present disclosure. FIG. 8H illustrates the current density as a function of voltage of the champion switchable PV devices in the dark (dashed) and under illumination (solid), according to some embodiments of the present disclosure. The inset table shows PV performance metrics of the device before being transitioned to transparent.

FIG. 12A illustrates the short-circuit current as a function of time for 20 cycles of 3 minutes of 1-sun illumination followed by 5 minutes of cooling in the dark. FIG. 12B illustrates the short-circuit current as a function of time for the first illumination cycle. The still-frames show the transition from transparent to colored and back to bleached at various times during the process. FIG. 12C illustrates the short-circuit current as a function of time for the $15^{th}$ cycle with corresponding still-frames showing continued device switching.

REFERENCE NUMBERS

Figure 1:
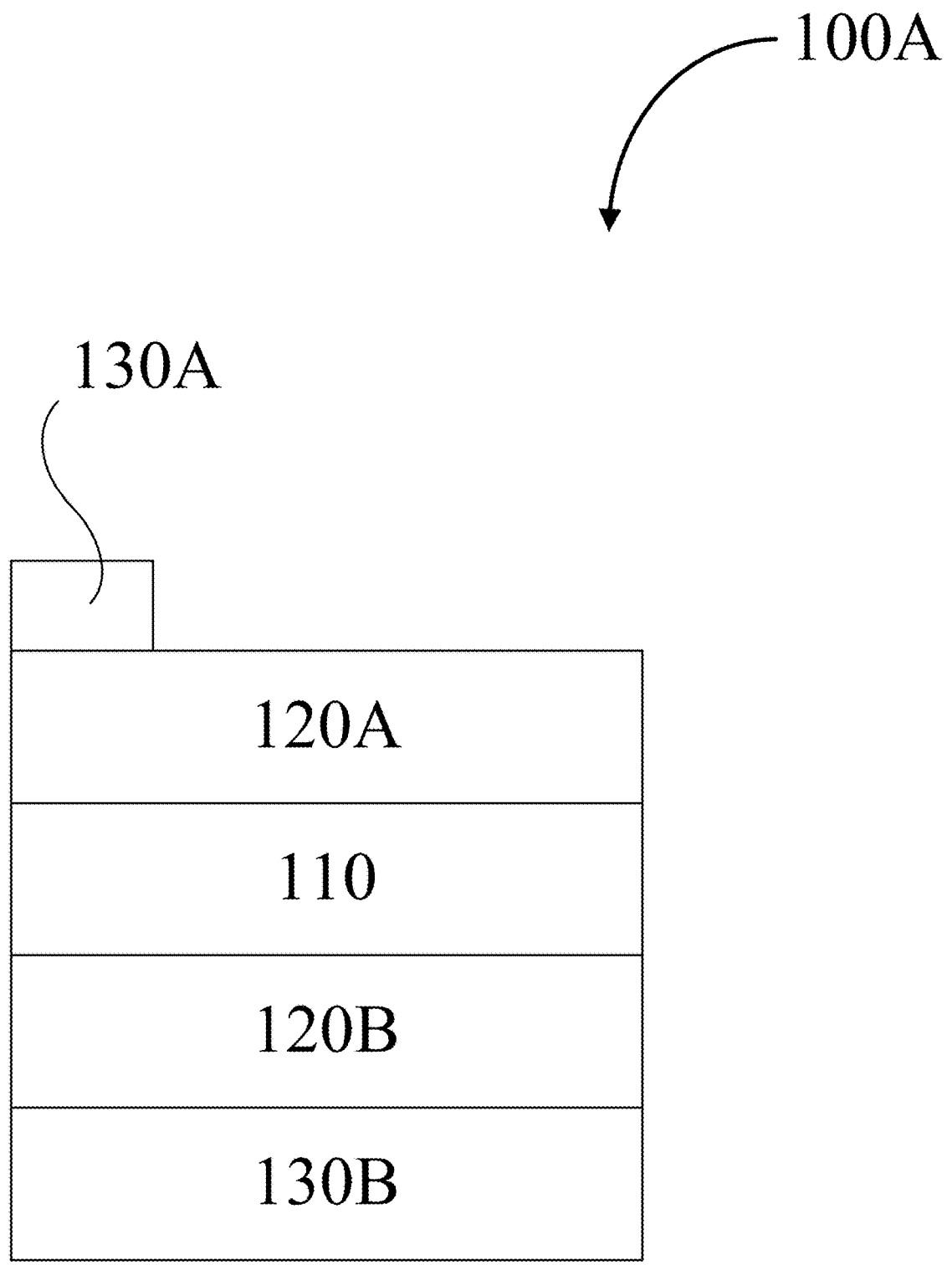
FIG. 1 illustrates a photovoltaic and/or emitting device, according to some embodiments of the present disclosure.

100 . . . device
110 . . . active layer

120 . . . charge transport layer
122 . . . first layer
124 . . . second layer
130 . . . charge collecting layer
300 . . . switchable device
310 . . . switchable layer in first state
320 . . . switchable layer in second state
330 . . . intercalating species reservoir
340 . . . switching mechanism

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

The present disclosure relates to improved photovoltaic devices, photo-emitting devices, and thermochromic devices (examples provided in U.S. Patent Application Publication No. 2017-0089128 A1, which is incorporated herein by reference in its entirety). FIG. 1 illustrates a general schematic of such a device 100A that includes an active layer 110 positioned between a first charge transport layer 120A and a second charge transport layer 120B. The device 100A also includes a first charge collecting layer 130A in electrical communication with the first charge transport layer 120A, and a second charge collecting layer 130B in electrical communication with the second charge transport layer 120B. In some embodiments of the present disclosure, the active layer 110 may absorb light to generate a voltage and/or a current, or the active layer 110 may emit light when a voltage and/or current is applied to the active layer 110. The active layer 110 may include at least one of a bulk inorganic semiconductor layer (silicon, germanium gallium arsenide, cadmium telluride, lead sulfide, etc.), an organic-inorganic semiconductor layer (e.g. methylammonium lead iodide), an organic semiconductor layer (e.g. conjugated polymers such as polyacetylene, phthalocyanine, polyethylene terephthalate, poly(3,4-ethylenedioxythiophene), poly (3-methyl-thiophene), poly(3-hexylthiophene) and fullerenes (C60, C70, etc.), their derivatives (phenyl-C61-butyric acid methyl ester, thienyl-$C_{61}$-butyric-acid-methyl ester, etc.), as well as bulk or planar heterojunctions composing a number of these components, and/or semiconductor quantum dots (e.g. silicon, germanium gallium arsenide, cadmium telluride, lead sulfide, cadmium selenide, etc.). The example of FIG. 1 illustrates only one active layer 110. However, it is to be understood that a such a device may include one or more active layers, for example, stacked on top of each other to maximize the amount of the sun's energy that is converted to electricity in a photovoltaic device.

In general, a charge transport layer 120 (120A and/or 120B) may be a hole transport layer or an electron transfer layer to enable the generation of charge separation within the device 100. In some embodiments of the present disclosure, at least one of the first charge transport layer 120A and/or the second charge transport layer 120B may include a single-walled carbon nanotube (SWCNT) and/or multi-walled carbon nanotube (MWCNT) layer. As used herein, "CNT" includes SWCNTs and MWCNTs. A CNT layer may be doped and/or wrapped in a polymer. The doping may include immersing the SWCNT network in a solution comprising a charge-transfer dopant until a charge carrier (electron or hole) doping level of the SWCNT network is saturated; e.g. having a carrier density between $1 \times 10^{19}$ and $1 \times 10^{21}$ per cubic centimeter. The charge carrier doping level of the SWCNT network can be further tuned by immersing the SWCNT network in a solvent to intentionally re-dissolve some of the adsorbed dopant. The charge-transfer dopant may include at least one of triethyloxonium hexachloroantimonate (OA, a p-type dopant), 2,3,5,6-Tetrafluoro-7,7,8, 8-tetracyanoquinodimethane ($F_4$TCNQ, a p-type dopant), amines (ammonia, primary, secondary, and tertiary alkyl- or arylamines, n-type dopants), phosphines (n-type dopants), and/or alkali crown ether complexes (n-type dopants). Carbon substitution dopants, such as nitrogen or boron, may also be employed.

The polymer used for wrapping a CNT may determine the chirality and/or length of the CNT and provide solubility in various solvents. The polymer may also provide energetic alignment to the active layer 110. CNTs may be dispersed in a fluorene-based polymer or co-polymer solution generated by dissolving polymer in toluene and/or an alternative solvent at a concentration between 0.4-2 mg/mL. The polymers used may include poly[(9,9-dioctylfluorenyl-2,7-diyl)-alt-co-(6,6'-{2,2'-bipyridine})] (PFO-BPy), poly[(9,9-dihexylfluorenyl-2,7-diyl)-co-(9,10-anthracene)] (PFH-A), poly (9,9-dioctylfluorenyl-2,7-diyl) (PFO), and/or "cleavable" polymers such as poly[2-ureido-6[1H]-pyrimidinone] (SMP) and poly[(9,9-di-n-dodecyl-2,7-fluorendiyl-dimethine)-(1,4-phenylene-dinitrilomethine)] (PF-PD). Additional polymers may include polythiophenes such as poly (3-hexylthiophene-2,5-diyl) (P3HT). Treatments may be employed to remove the polymer. A solvent soak (e.g. toluene) was used in one example and removed excess fluorene-based polymer or co-polymer, leaving polymer wrapped CNTs in a mass ratio between greater than 0.1:1 and approximately 1:1 (polymer:CNTs), and enabling close physical contact and efficient electronic coupling between CNTs. For "cleavable" polymers, a soak in dilute trifluoroacetic acid breaks the bonds in between monomers, enabling complete removal of the polymer.

In general, a charge collecting layer 130 (130A and/or 130B) may be any suitable, highly conductive material that enables the removal of the charges generated in or provided to the active layer 110. In some embodiments of the present disclosure, at least one of the first charge collecting layer 130A and/or the second charge collecting layer 130B may include at least one of the CNT combinations described above for the charge transport layers (120A and 120B) with a higher dopant density. The specific number, combination, and order of the various layers of a specific device will be dictated by the specific use and/or design requirements of the device.

Figure 2:
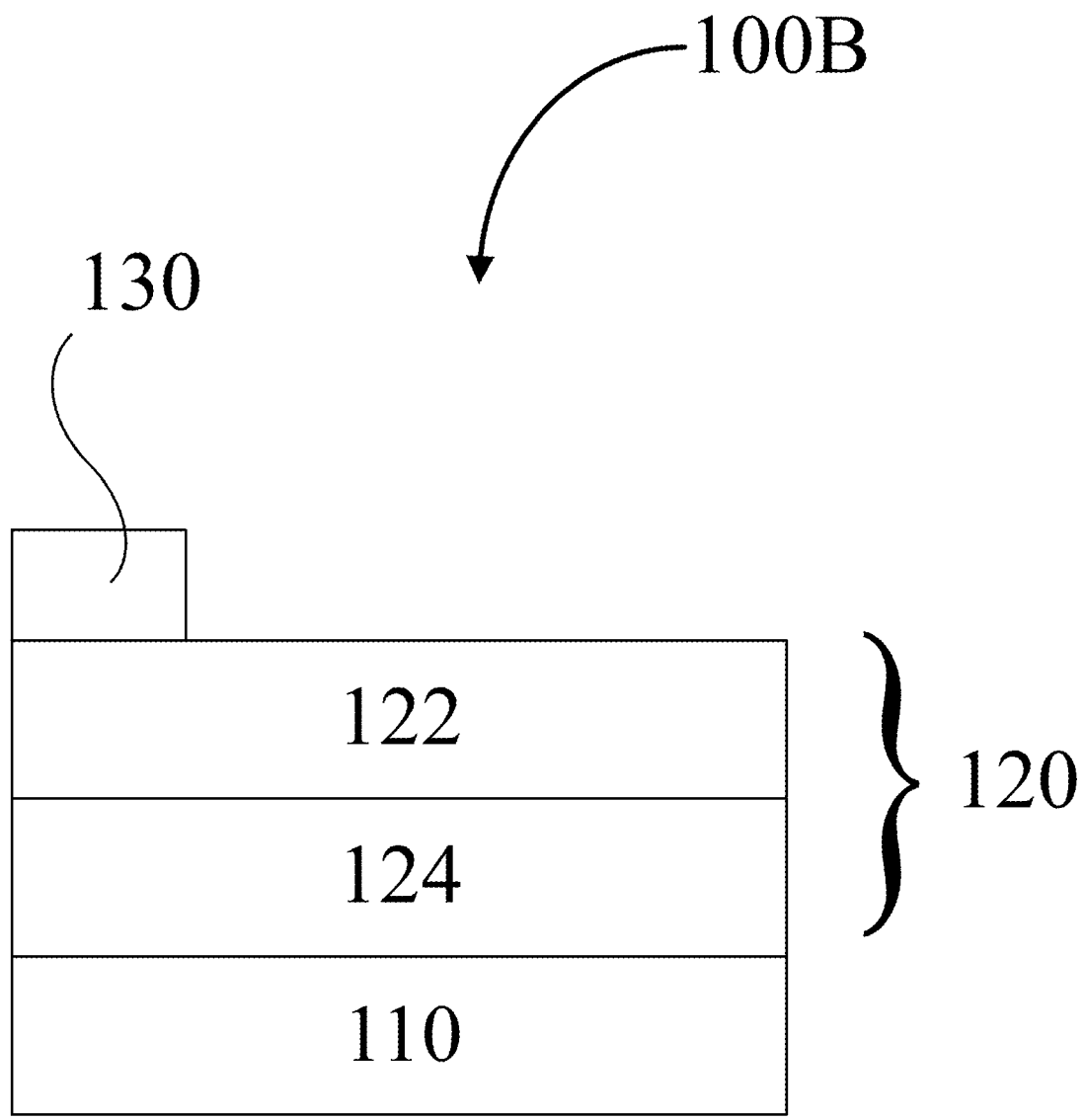
FIG. 2 illustrates a photovoltaic and/or light-emitting device having a charge transport layer containing a first layer and a second layer, according to some embodiments of the present disclosure.

FIG. 2 illustrates a schematic of a device 100B that includes an active layer 110 in electrical communication with a charge transport layer 120 having a second layer 124 positioned between the active layer 110 and a first layer 122. The first layer 122 of the charge transport layer 120 may also be in contact with a charge collecting layer 130. In some embodiments of the present disclosure, the first layer 122 may behave like a charge transport layer, while the second layer 122 provides a performance enhancing attribute; e.g. improved band gap alignment, improved charge transport, etc. Examples of such improvements are provided below. Thus, the first layer 122 may be made from CNTs composed of the elements described above for layers 120A,B and 130A,B for FIG. 1. The second layer 124 may be also be composed of these elements. The elements that compose layer 124 combine to provide favorable energetic alignment with the active layer 110 (that is, favored electron (hole) extraction and hole (electron) blocking). The elements that compose layer 122 combine to provide favorable alignment with layer 124 and enhanced lateral carrier transport. The charge collecting layer 130 may include a metallic layer for lateral transport.

Figure 3:
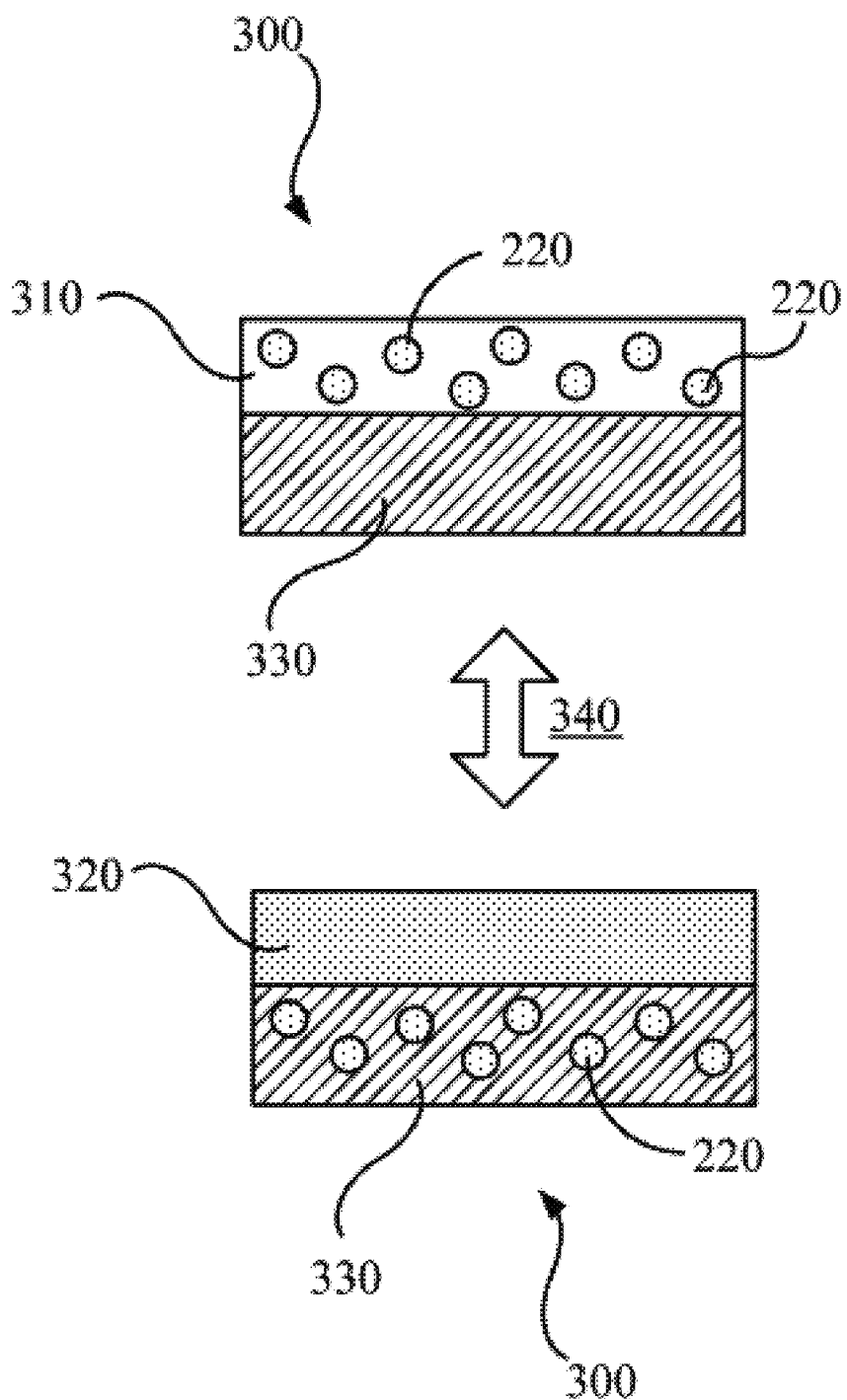
FIG. 3 illustrates a switchable layer that is reversibly switchable between a first state 310 that is transparent and a second state 320 that is opaque, according to some embodiments of the present disclosure.

FIG. 3 illustrates a switchable device 300 having a switchable layer (310 and 320), which may be in the form of a film and/or a layer that may be reversibly switched between a first transparent state 310 to a second tinted state 320, utilizing a switching mechanism 340. Switching of the switchable device 300 between the switchable layers two states (310 and 320) may be induced by an energy input into the device containing the switchable layer (310 and 320) such as solar radiation and/or any other suitable energy source and/or heat source. Other switching mechanisms may include introducing an electrical bias and/or subjecting the switchable device 300 to a mass concentration gradient that drives the intercalating species between the switchable material and the intercalating species reservoir; e.g. by flowing gas over a surface of the switchable material. In some embodiments of the present disclosure, the switchable layer (310 and 320) has been shaped into a specific shape or form, in this example, a film and/or layer. In some embodiments of the present disclosure, the switchable layer (310 and 320) may be in any other suitable shape and/or form; e.g. spheres, cylinders, rods, and/or cones, etc. In addition, the switchable layer (310 and 320) may have at least one textured surface. In the example of FIG. 3, the switchable layer (310 and 320) is shown positioned adjacent to an intercalating species reservoir 330. When the switchable layer is in a first transparent state 310, intercalating species 220 are intercalated into the switchable layer 320. As shown in the example of FIG. 3, while the switchable layer is in the first transparent state 310, none and/or a fraction of the intercalating species 220 may be contained in an intercalating species reservoir 330. When switched to the second tinted state 320, all or substantially all of the intercalating species 220 may diffuse out of the switchable layer 320 into the intercalating species reservoir 330. However, it should be understood, that in some embodiments of the present disclosure, removal of intercalating species 220 from the switchable layer and/or the intercalating species reservoir 330 may be less than 100% complete; e.g. when the switchable layer is in a first transparent state 310, some intercalating species 220 may remain in the reservoir 330, and when in a second tinted state 320, some intercalating species 220 may remain in the switchable material.

In some embodiments of the present disclosure, an intercalating species reservoir 330 may be a space positioned adjacent to the switchable layer (310 and 320) such that the space is filled with at least one of a gas, a liquid, and/or a solid. When an intercalating species reservoir 330 includes a space filled with a gas, the space may be at any suitable pressure, from pressures above atmospheric pressure (e.g. about 760 torr up to 1550 torr) to pressures equal to or approaching absolute vacuum (e.g. about $10^{-11}$ up to 760 torr). In some embodiments of the present disclosure, a gas may be contained in an intercalating species reservoir 330 (e.g. a space) that is completely enclosed and isolated from the environment external to the device 300, with no inlet and/or outlet to allow for the transfer of gas and/or intercalating species 330 between the intercalating species reservoir 330 and an environment external to the device 300. In some embodiments of the present disclosure, at least one port 430 may be positioned within the intercalating species reservoir 330 such that the intercalating species 220 may be reversibly added and/or removed from the intercalating species reservoir 330. In some embodiments of the present disclosure, an intercalating species reservoir 330 in the form of an empty space may be positioned relative to the switchable layer (310 and 320) such that there are no physical barriers to mass-transfer between the space and the switchable layer (310 and 320).

Figure 4A:
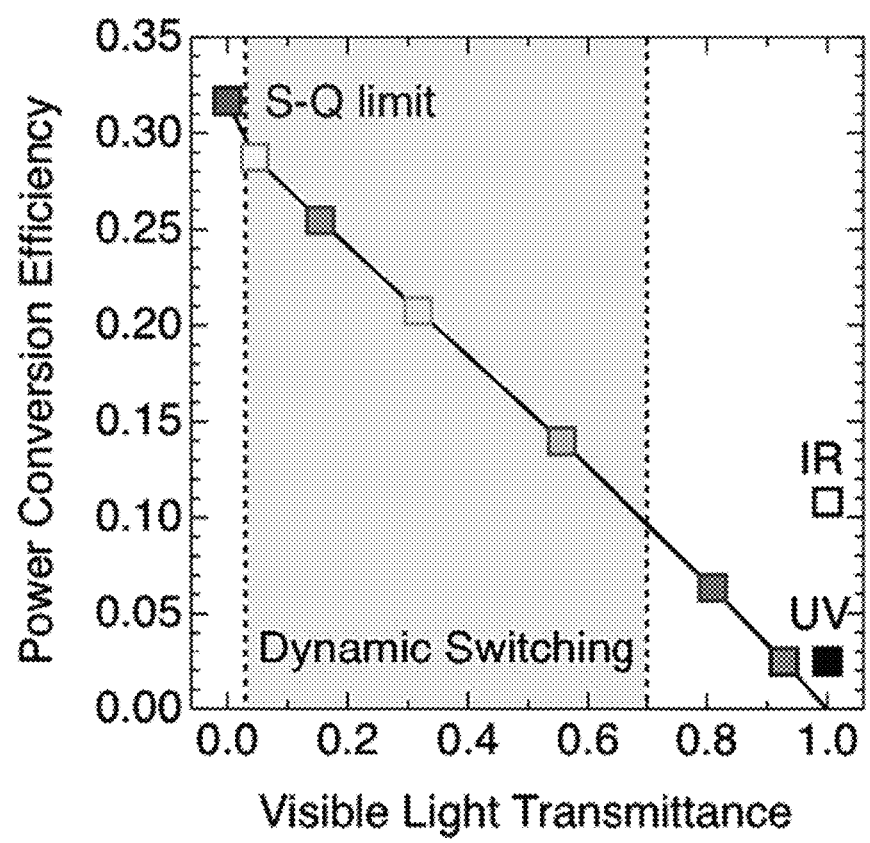
FIGS. 4A, 4B, and 4C illustrate methods for circumventing the tradeoffs found in window-integrated PV (WIPV) devices, according to some embodiments of the present disclosure.
Figure 4B:
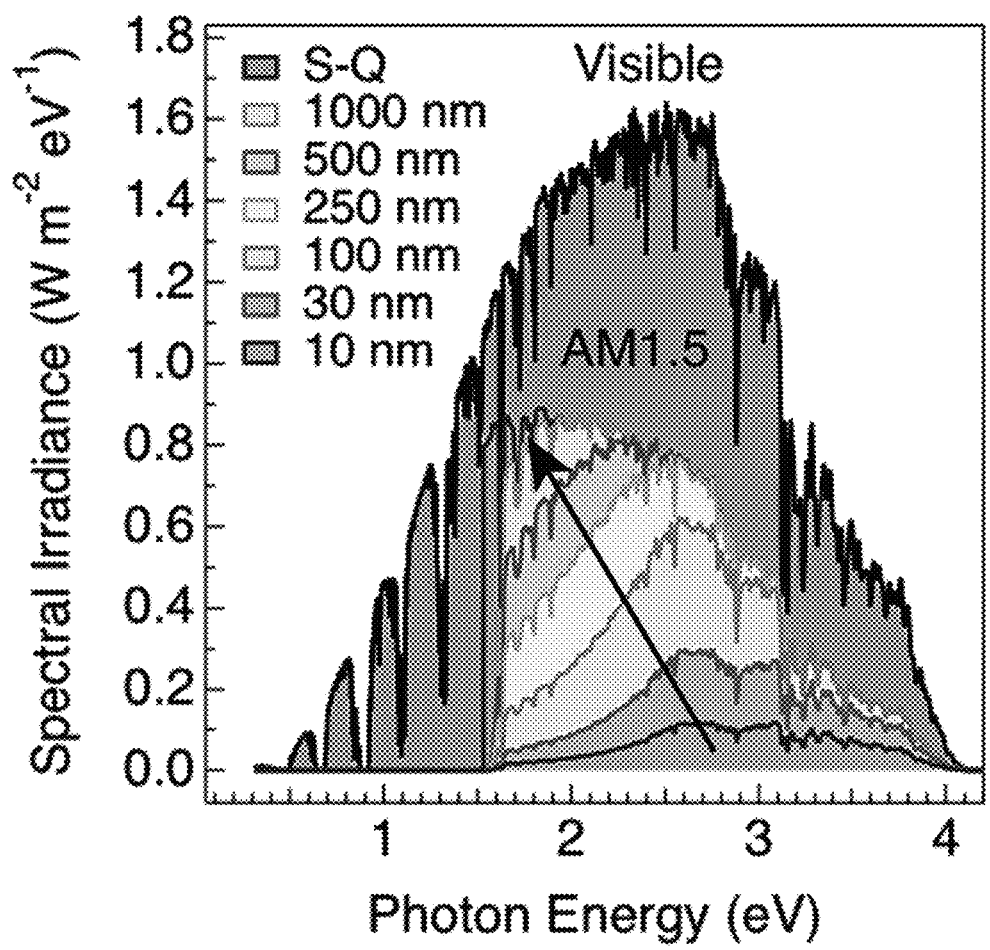

Unlike conventional PV technologies that maximize light absorption through optically dense films, WIPV designs may achieve high solar-to-electrical power conversion efficiency (PCE) while maintaining visible light transmittance (VLT) for acceptable window performance. For this reason, the non-visible regions of the solar spectrum may be targeted for conversion. However, the complex organic materials capable of IR-only conversion constrain these systems to below the thermodynamic limit with a practical PCE limit of 10.8% (see marker labeled IR in FIG. 4A), and the ultraviolet (UV) portion of the spectrum makes up only a small fraction of the solar spectrum to provide a theoretical maximum PCE of 2.5% (see marker labeled UV in FIG. 4A). As a result, typical WIPV designs feature semitransparent absorber films that are thin enough to absorb only a fraction of the visible spectrum. As shown in FIG. 4A for calculations based on methylammonium lead iodide ($CH_3NH_3PbI_3$, MAPI), the ultimate drawback of semitransparent WIPV is that the PCE decreases nearly linearly with VLT. Fewer photons are converted as a perfect absorber (see arrow-head inf FIG. 4B), which corresponds to the Shockley-Queisser (S-Q) limit, is reduced to a 10 nm thick absorber (see tail of the arrow in FIG. 4B). Semitransparent WIPV designs thus suffer from the fundamental tradeoff between PCE and VLT.

Figure 4C:
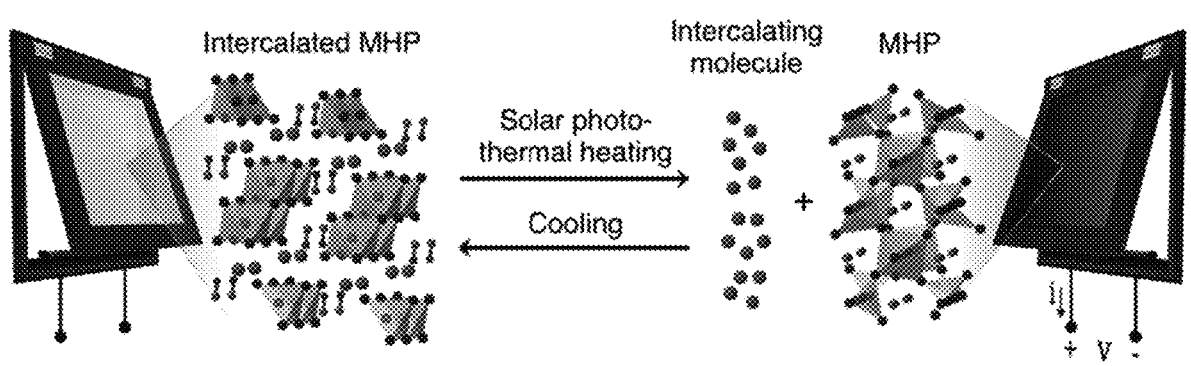
Figure 5:
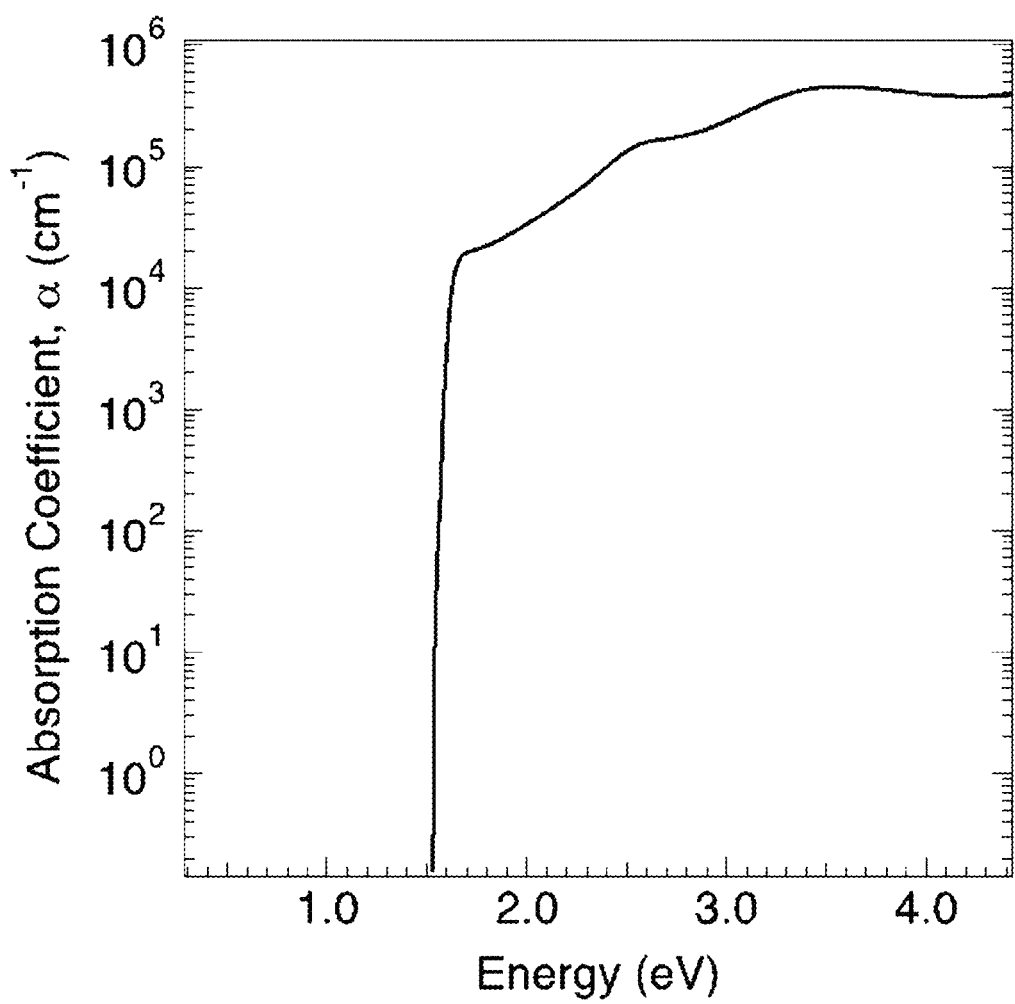
FIG. 5 illustrates the absorption coefficient as a function of energy for single crystal of methylammonium lead iodide (MAPI), according to some embodiments of the present disclosure.

Thus, as described herein, the tradeoff between PCE and VLT inherent in static absorber materials is circumvented with the demonstration of a "switchable" WIPV device containing an MHP absorber layer that is photothermally modulated between a high-VLT transparent state and a photovoltaic colored state. This is possible due to the low formation energy of MHP materials, which allows for intercalation/de-intercalation of polar molecules with small changes in energy. It is shown herein that this energy can be delivered with sunlight, as shown schematically in FIG. 4C. At ambient temperature, molecular intercalation disrupts the MHP structure to yield a transparent state. Upon solar illumination, photothermal heating leads to de-intercalation of the species from the MHP material to yield the relatively opaque, colored photovoltaic state. Cooling reverses the processes by allowing molecules to intercalate back into the MHP that then returns to the transparent state.

Figure 6A:
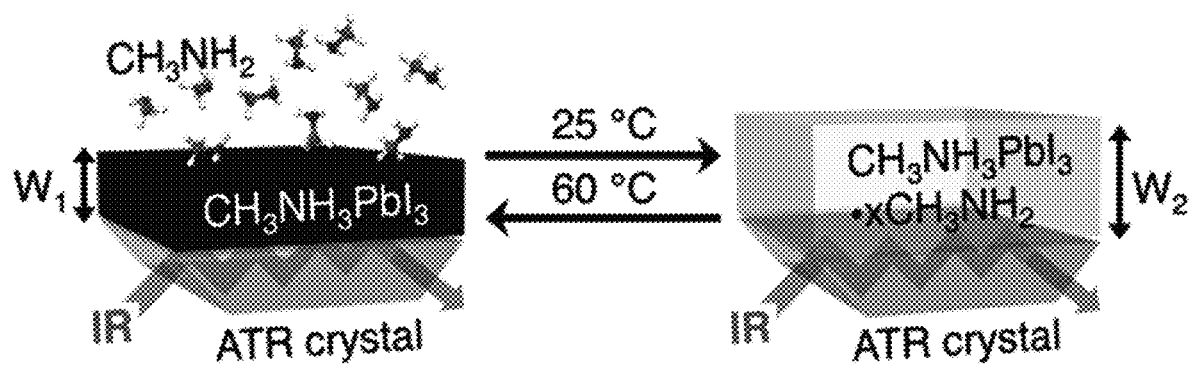
FIG. 6A illustrates a mechanism of the reversible thermal modulation of molecular $CH_3NH_2$ intercalation in a MAPI film deposited on an ATR crystal, according to some embodiments of present disclosure. Intercalation results in an increase in film thickness ($W_2 > W_1$).
Figure 6B:
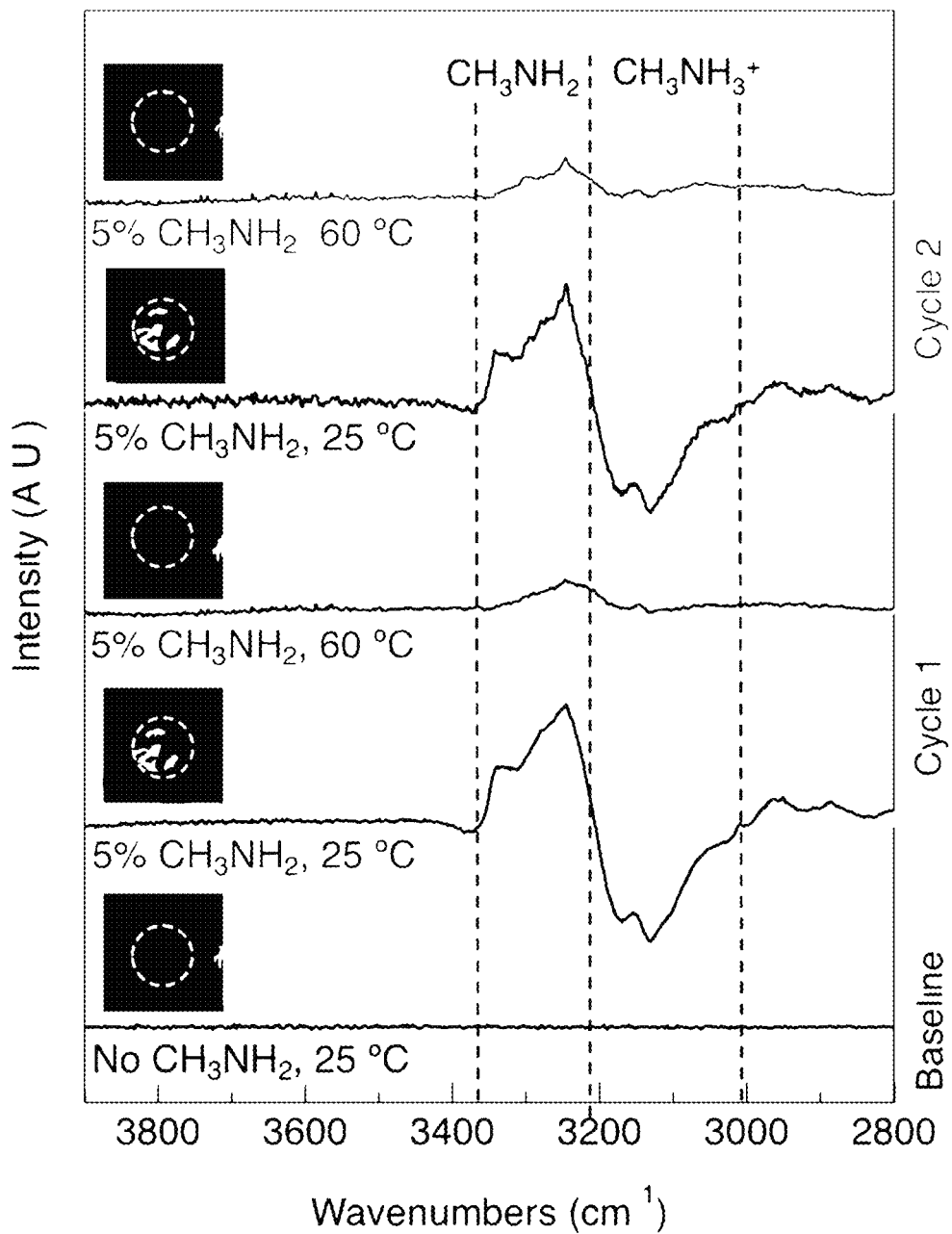
FIG. 6B illustrates differential FTIR spectra for two transparent-to-colored WIPV cycles. All spectra are referenced to the initial signal from the $CH_3NH_3PbI_3$ film at 25° C. under vacuum with no $CH_3NH_2$ present (baseline). A positive peak due to the amine ($v_{N-H}$) stretching vibration of the intercalating $CH_3NH_2$ after 5% partial pressure of $CH_3NH_2$ was introduced and balanced to atmospheric pressure with Ar. The negative peak highlighted is due to increased film thickness and thus decreased signal from $CH_3NH_3^+$ ions in the detection region of the intercalated film. The film was visibly transparent, which is shown in the optical image to the left of the corresponding spectrum with a dashed white circle that outlines the ATR crystal. Upon heating the ATR crystal to 60° C. with the film in the same atmosphere, the film visually returned to the colored state and the spectrum confirms nearly complete de-intercalation with some residual $CH_3NH_2$. The stage around the ATR crystal was not heated. The ATR crystal was cooled and heated again in cycle 2 to yield the top two spectra. The spectra are not normalized and are offset for clarity. The background due to thin film interference of each spectrum was subtracted with a polynomial fit.

Reversible intercalation of methylamine ($CH_3NH_2$) into MAPI is demonstrated herein using Fourier transform infrared spectroscopy (FTIR) in FIG. 6B. MAPI was cast from solution onto an attenuated total reflectance (ATR) crystal to yield a film of thickness $W_1$, shown schematically in FIG. 6A. The film is highlighted with a dashed white circle in the inset optical image (see FIG. 6B). The film was sealed in a glass chamber and placed under static vacuum (~$40 \times 10^{-3}$ torr). FTIR signal from this film was then zeroed to give the baseline spectrum in FIG. 6B. The atmosphere of the glass chamber was filled with 5% partial pressure of $CH_3NH_2$ in Ar at atmospheric pressure (~620 torr). The environment was closed, and no more $CH_3NH_2$ was introduced during the experiment. Introduction of 5% $CH_3NH_2$ atmosphere caused the MAPI film to bleach (inset image), and $CH_3NH_2$ ($v_{N-H}$) vibrations emerged from the baseline centered at 3250 cm$^{-1}$ to confirm intercalation of $CH_3NH_2$ into the MAPI film. The MAPI film increased in thickness as a result of intercalation ($W_2 > W_1$, FIG. 6A). Film expansion lead to decreased signal from N—H$_x$ stretching vibrations of methylammonium (CH$_3$NH$_3^+$) cations in the MAPI film, which was manifested as a negative peak centered at 3130 cm$^{-1}$.

The transparent-to-colored cycle was completed by heating the ATR crystal to 60° C., which is similar to the color switching threshold temperature of 68° C. used in vanadium dioxide thermochromic window technology. It is clear from the inset optical images that the film reverted back to the colored state. Signal due to CH$_3$NH$_3^+$ returned to its baseline level, and the intensity of the CH$_3$NH$_2$ peak was largely reduced due to de-intercalation of CH$_3$NH$_2$ from the MAPI film back into the vapor phase, though some residual CH$_3$NH$_2$ still remains. A second cycle is displayed to demonstrate repeated reversible switching.

Reversible bleached-to-colored modulation using solar-simulated illumination in a full PV device stack is describe below. A particular challenge was to engineer hole transport and top contact layers that meet four required criteria: (i) high electrical conductivity, (ii) favorable energetic alignment with the MAPI layer, (iii) significant transparency in the visible portion of the solar spectrum, and (iv) permeability to CH$_3$NH$_2$ vapor. A number of architectures were explored and are summarized in Table 1.

Figure 10:
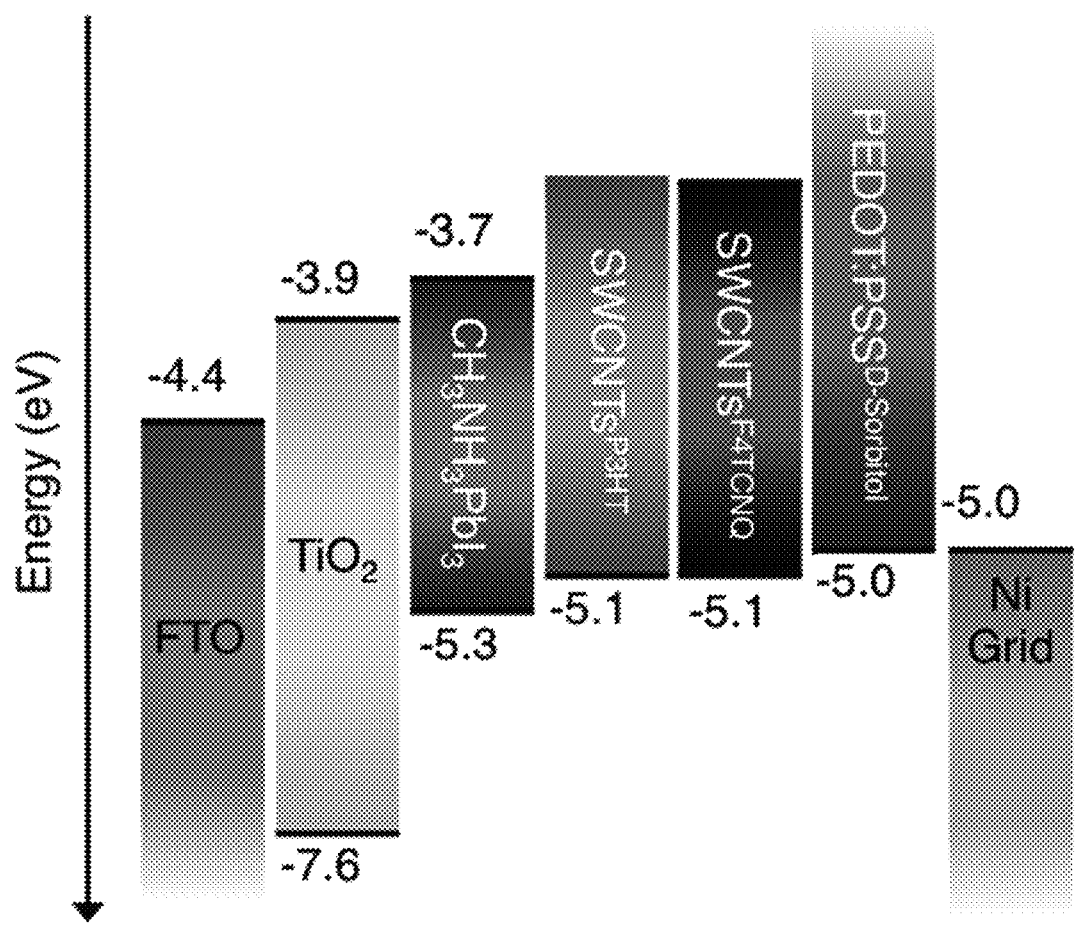
FIG. 10 illustrates the energy diagram of a switchable PV device, according to some embodiments of the present disclosure, according to some embodiments of the present disclosure.

SWCNT$^{F4TCNQ}$ and the micromesh. The nickel micromesh was then adhered to the SWCNT$^{F4TCNQ}$ layer with gentle mechanical pressure to complete the PV device. The PEDOT:PSS$^{D\text{-}Sorbitol}$ layer functions as an effective hole transport layer. The energy diagram describing the full device architecture is illustrated in FIG. 10.

The two layers of SWCNTs are important to the function of the double-layer SWCNT layer described above. As shown in Table 1, if only the doped SWCNT layer is in contact with the perovskite active layer, the power conversion efficiency is extremely low and the device does not function well at all. However, when the undoped SWCNT layer (the second layer 124 of FIG. 2) is used in between the heavily doped (conductive) layer (the first layer 122 of FIG. 2) and the perovskite active layer (active layer 110 of FIG. 2), the device functions very well, with power conversion efficiency exceeding 10%. Thus, the undoped SWCNT layer (second layer 124) appears to provide the appropriate energy level matching and charge extraction from the device active layer 110, after which the charge lifetime in the undoped layer is very long. This allows the charges to diffuse to the conductive SWCNT layer (the first layer 122) where they can be extracted to the charge collecting layer 130, into the

TABLE 1

Device performance for various hole transport architectures

| Hole Transport Architecture | Visibly Transparent | Vapor Permeable | $V_{OC}$ (V) | $J_{SC}$ (mA cm$^{-2}$) | FF (%) | PCE (%) |
|---|---|---|---|---|---|---|
| SWCNT$^{F4TCNQ}$/PEDOT:PSS$^{D\text{-}Sorbitol}$/Ni Grid | Yes | Yes | 0.71 ± 0.24 | 0.6 ± 0.1 | 0.19 ± 0.04 | 0.08 ± 0.02 |
| SWCNT/P3HT/PEDOT:PSS$^{D\text{-}Sorbitol}$/Ni Grid | Yes | Yes | 0.87 ± 0.01 | 20.7 ± 0.5 | 0.34 ± 0.06 | 6.2 ± 1.1 |
| SWCNT/P3HT/SWCNT$^{F4TCNQ}$/PEDOT:PSS$^{D\text{-}Sorbitol}$/Ni Grid | Yes | Yes | 0.93 ± 0.01 | 20.6 ± 0.7 | 0.54 ± 0.03 | 10.3 ± 0.9 |
| Spiro-OMeTAD/PEDOT:PSS$^{D\text{-}Sorbitol}$/Ni Grid* | Yes | Yes | 0.96 ± 0.04 | 0.2 ± 0.1 | 0.20 ± 0.01 | 0.04 ± 0.01 |
| Spiro-OMeTAD/Au | No | No | 1.05 ± 0.01 | 21.2 ± 0.3 | 0.73 ± 0.01 | 16.3 ± 0.1 |

Figure 8A:
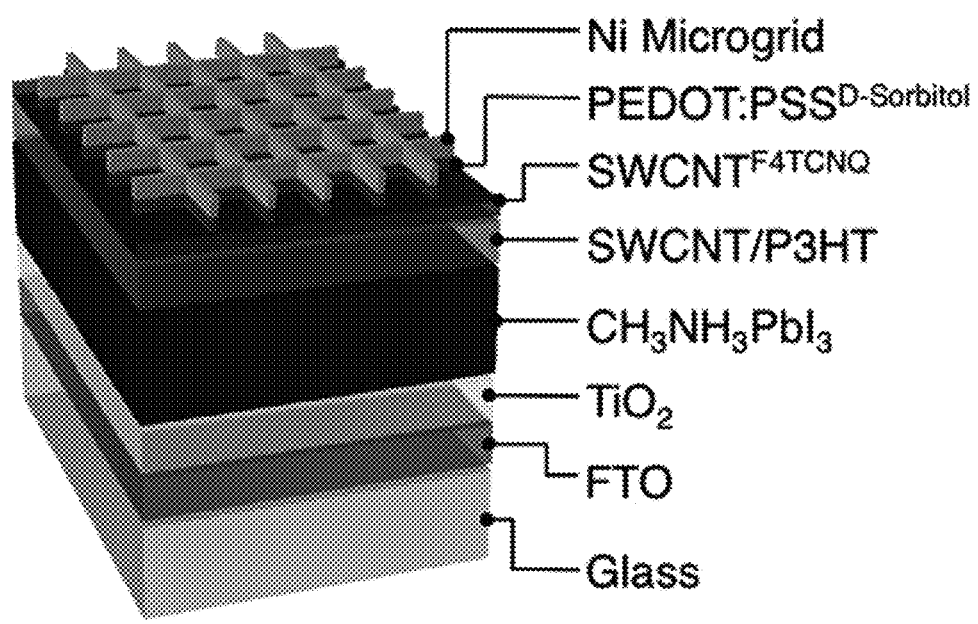
FIGS. 8A-8H illustrate the composition and performance of switchable WIPV devices, according to some embodiments of the present disclosure.
Figure 9:
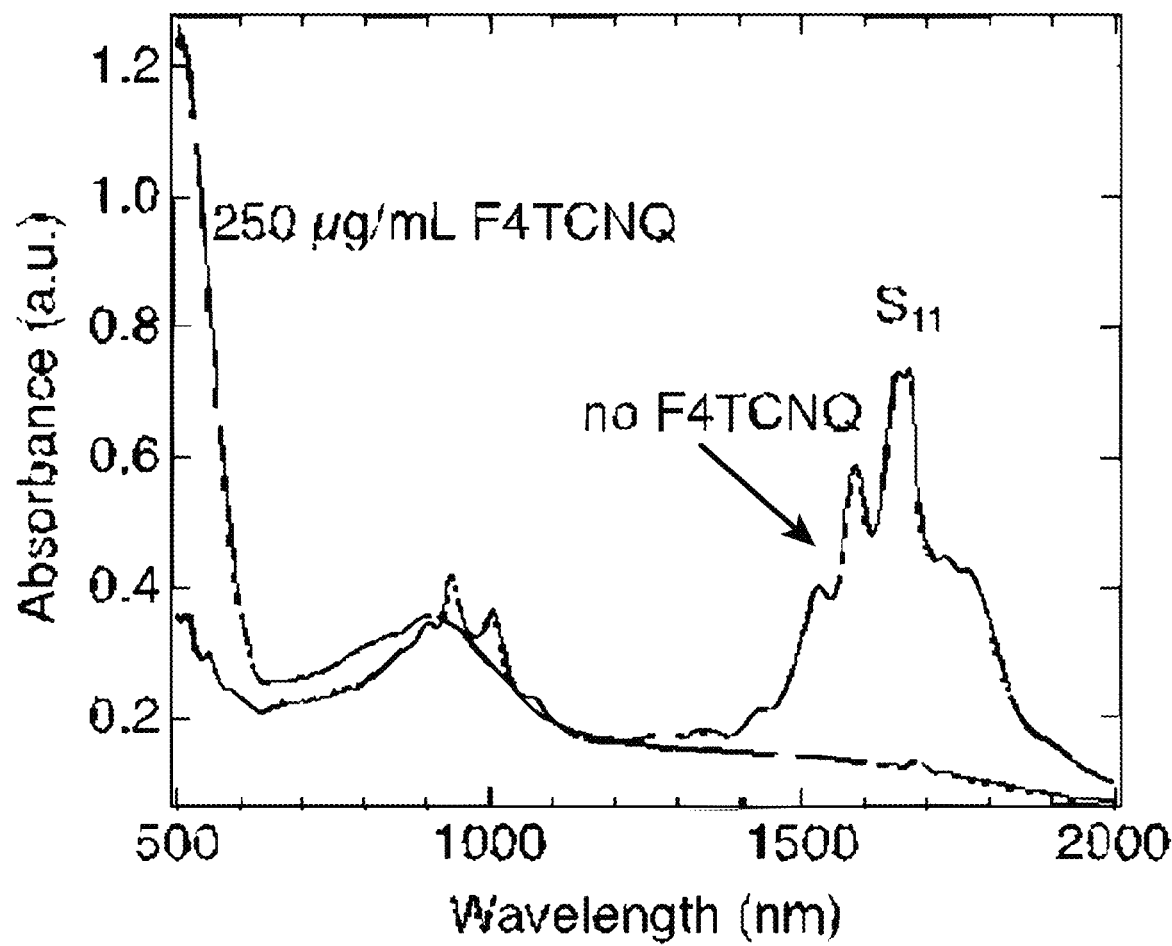
FIG. 9 illustrates optical absorption spectra of ink used to generate SWCNT$^{F4TCNQ}$ layer, according to some embodiments of the present disclosure. A SWCNT/PFPD ink was doped in the solution phase with the charge transfer dopant $F_4TCNQ$ at a doping concentration of 250 µg/mL. Adding $F_4TCNQ$ to the SWCNT ink results in bleaching of the $S_{11}$ transitions, indicative of a charge transfer interaction between the dopant and SWCNTs in the solution phase. The ink that was sprayed directly onto the SWCNT/P3HT layer in the device stack.

As shown herein, four complimentary layers on top of the typical planar MAPI device architecture resulted in optimal performance in both VLT and PCE. A schematic of the full architecture is illustrated in FIG. 8A. MAPI was deposited on titanium dioxide (using established methods) as the electron transport layer and fluorine-doped tin oxide as the transparent bottom contact. The MAPI was coated with a hole transport layer of single-walled carbon nanotubes wrapped in poly(3-hexylthiophene) (SWCNT/P3HT). This layer is porous, visibly transparent, and is a promising alternative to 2,2',7,7'-Tetrakis(N,N-di-p-methoxyphenylamine)-9,9'-spirobifluorene (spiro-OMeTAD). Spiro-OMeTAD enables excellent PV performance but leads to degradation of the MAPI absorber in PV devices. A second layer of SWCNTs doped with 2,3,5,6-Tetrafluoro-7,7,8,8-tetracyanoquinodimethane (SWCNT$^{F4TCNQ}$) was spray-coated to improve lateral electrical transport to the top contact. F4TCNQ is a charge-transfer dopant that enhances p-type conductivity within each SWCNT (see FIG. 9). This layer was also chemically treated with trifluoroacetic acid after deposition to de-polymerize and remove the wrapping polymer that provides solubility in order to enhance electrical conductivity between SWCNTs. An electrical contact to the top of conventional MHP PV devices was made with evaporated metal. A nickel micromesh was laminated to provide high electrical conductivity and 88% optical transparency. The nickel mesh was laminated to the SWCNT$^{F4TCNQ}$ layer by first spray-coating poly(3,4-ethylene dioxythiophene):poly(styrenesulfonate), an electrically conductive polymer, doped with D-sorbitol (PEDOT:PSS$^{D\text{-}Sorbitol}$) that serves as an "electric glue" between the external circuit as current. This allows for many variations on this double-layer electrode. The undoped layer (the second layer 124) can be highly enriched semiconducting SWCNTs or mixed (metallic and semiconducting) SWCNTs, as long as they are not doped sufficiently to have high carrier density; e.g. less than about 1×10$^{17}$ per cubic centimeter. Any number of polymers and/or surfactants may be used to generate this layer, as long as the polymers/surfactants does/do not dope the SWCNTs. The conductive SWCNT layer (the first layer 122) may also include any ratio of semiconducting to metallic SWCNTs, as long as they are sufficiently doped; e.g. having a carrier density between 1×10$^{19}$ and 1×10$^{21}$ per cubic centimeter. Any number of different diameters and diameter distributions can also be used to produce both of the layers, with the full range of commonly synthesized SWCNT diameters being feasible (between 0.6 nm and 2.0 nm).

Figure 8B:
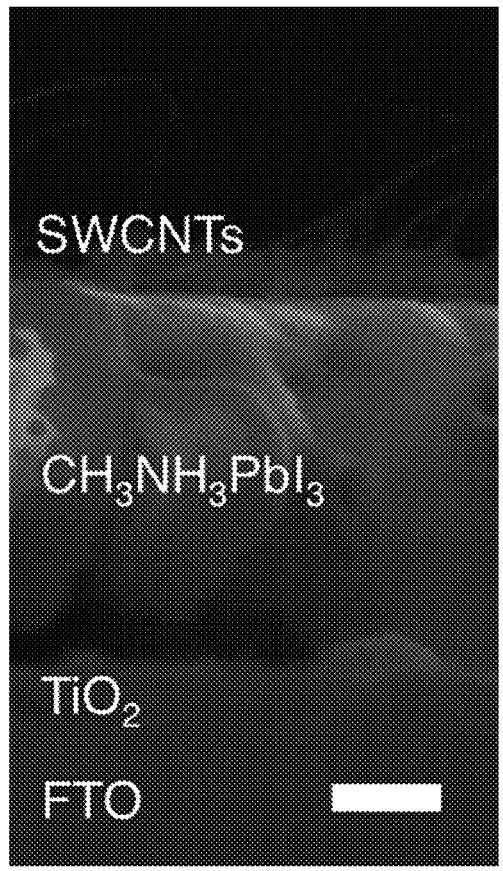
Figure 8C:
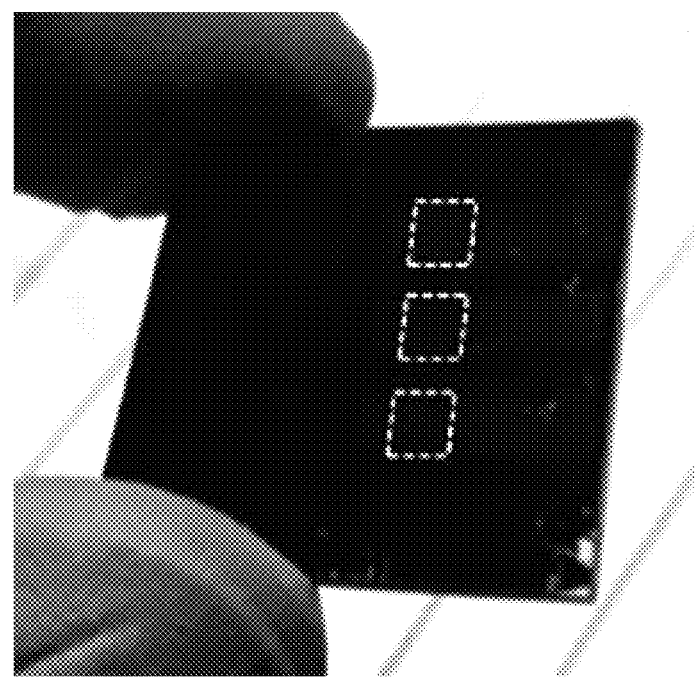
Figure 8D:
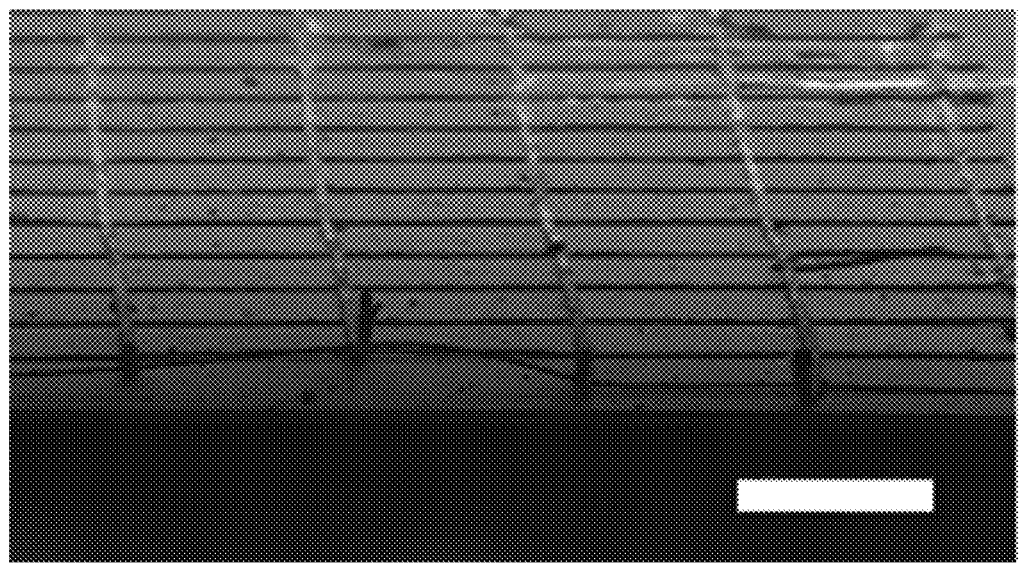
Figure 8E:
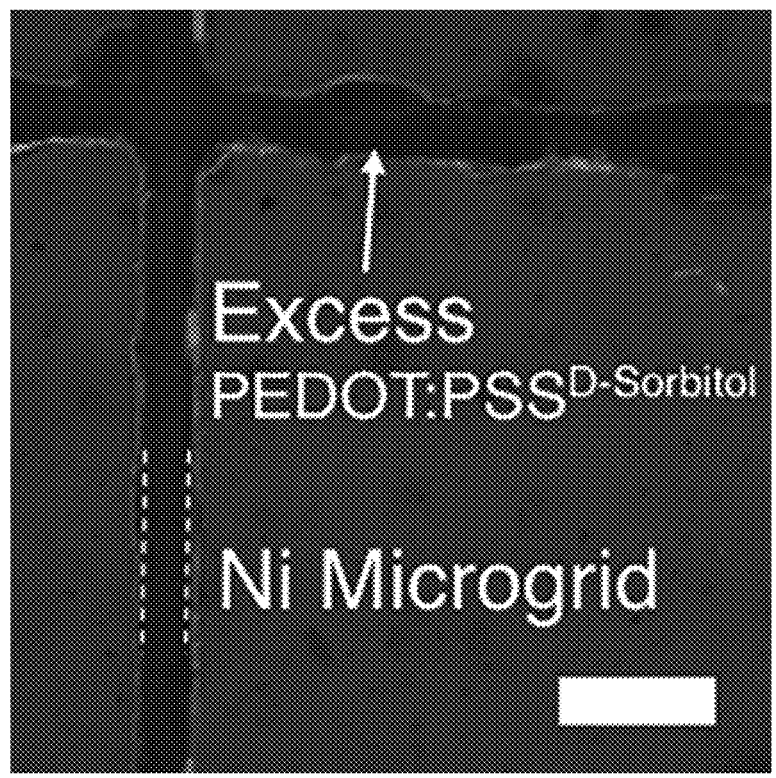
Figure 8F:
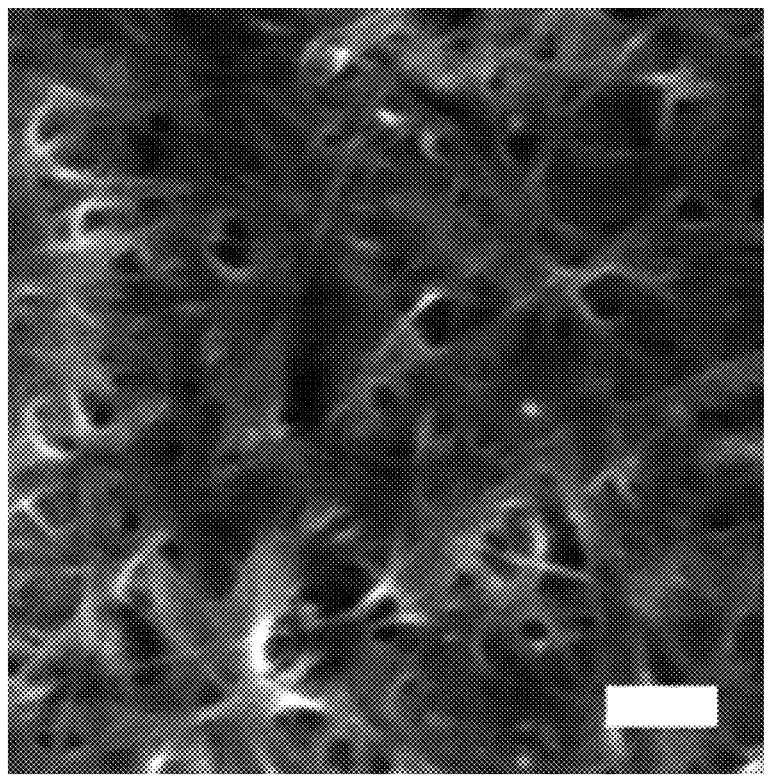

FIG. 8B illustrates a scanning electron microscopy (SEM) image of the device cross-section. A 600 nm-thick MAPI absorber layer was deposited on a 100 nm-thick layer of TiO$_2$. The two SWCNT layers formed a continuous and wispy layer of approximately 100 nm. The SWCNT/P3HT polymer-containing layer cannot be distinguished from the SWCNT$^{F4TCNQ}$ doped layer in the image. Details regarding chirality/diameter distributions are supplied below for these two distinct SWCNT layers. FIG. 8C illustrates a photograph highlighting three pixels (dashed white boxes) completed with the nickel microgrid top contact. Continuous adhesion of the nickel microgrid is shown in FIG. 8D, with the exception of where the device was cross-sectioned in the foreground of the SEM image. FIG. 8E is an SEM image that highlights excess PEDOT:PSS$^{D\text{-}Sorbitol}$ that is also beneath the nickel microgrid layer to adhere it to the SWCNT$^{F4TCNQ}$ layer. FIG. 8F is an SEM image illustrating the porosity of the SWNT layers, which is needed for CH$_3$NH$_2$ vapor permeation into the MAPI layer.

Figure 8G:
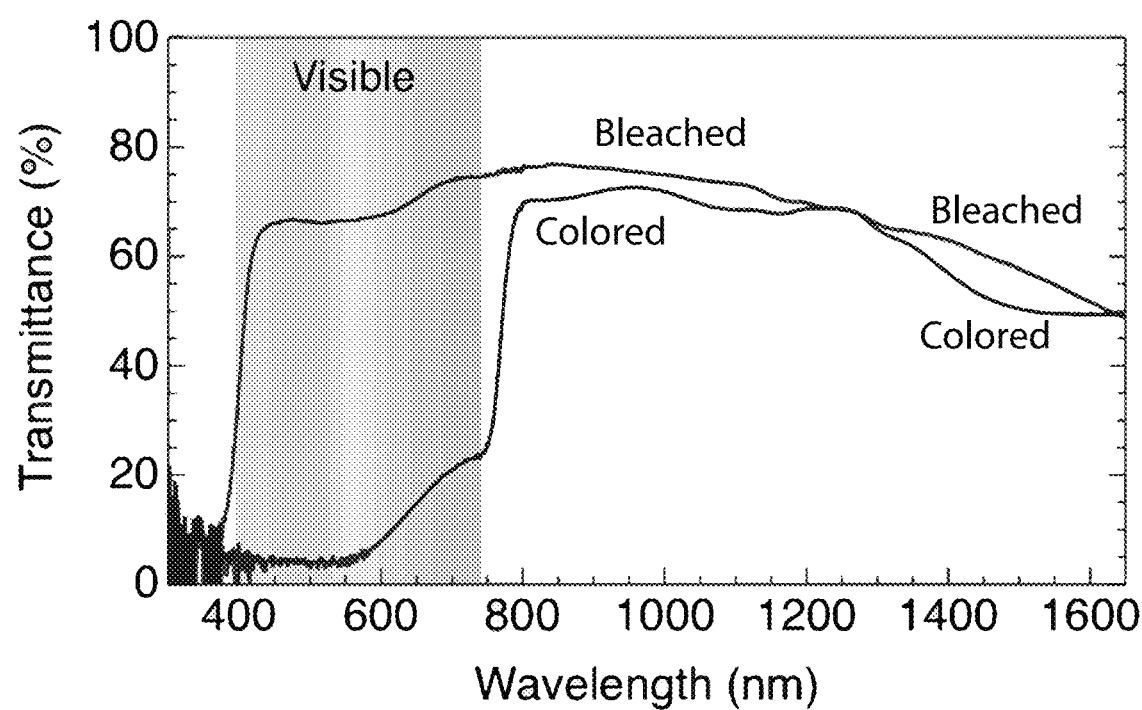

VLT is an important metric for WIPV devices. FIG. 8G shows the transmittance of the full device stack spanning UV to IR portions of the electromagnetic spectrum. The visible portion is highlighted to illustrate reversible switching in this region. The device was highly absorbing in the visible portion in the colored state with an average VLT of 3%, which is a standard upper limit needed for building occupant comfort from direct sun glare. The VLT increased to 68% when in the transparent state (5% pressure CH$_3$NH$_2$ in argon at room temperature). The observed decrease in transmittance in the infrared region is due to thin film interference and FTO absorption that is featured in current low-emissivity films used in current high-performance window technology.

Figure 8H:
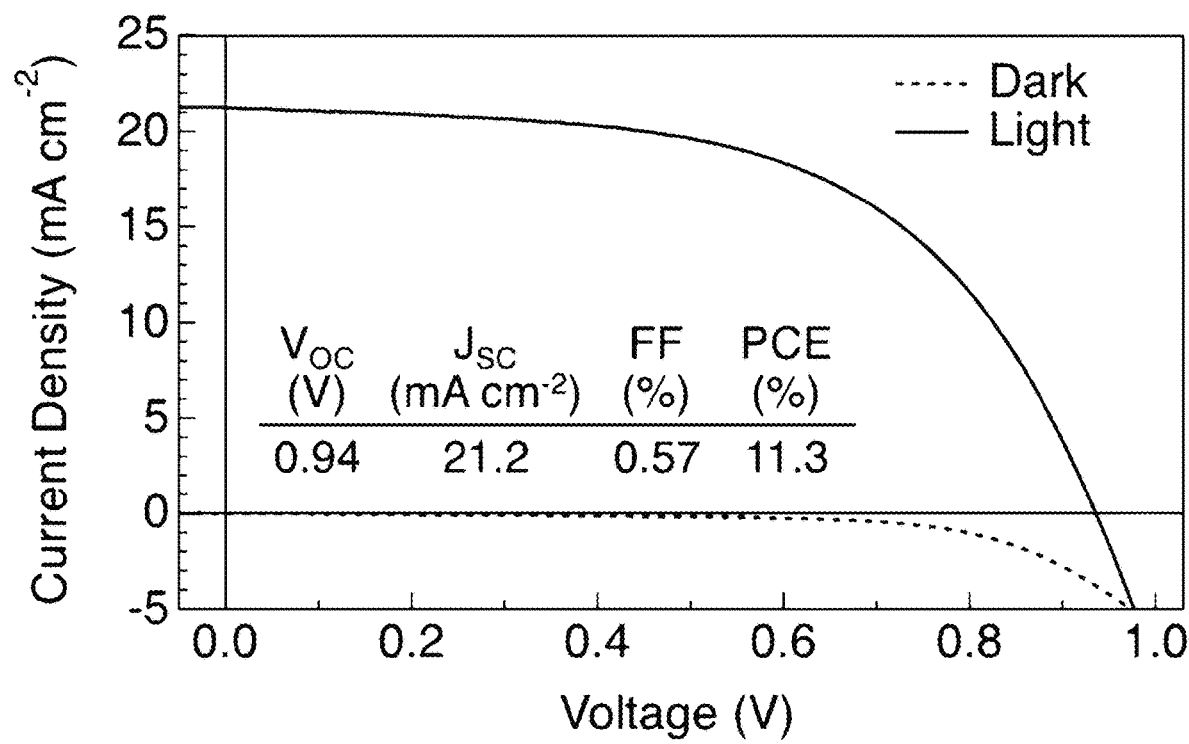
Figure 11:
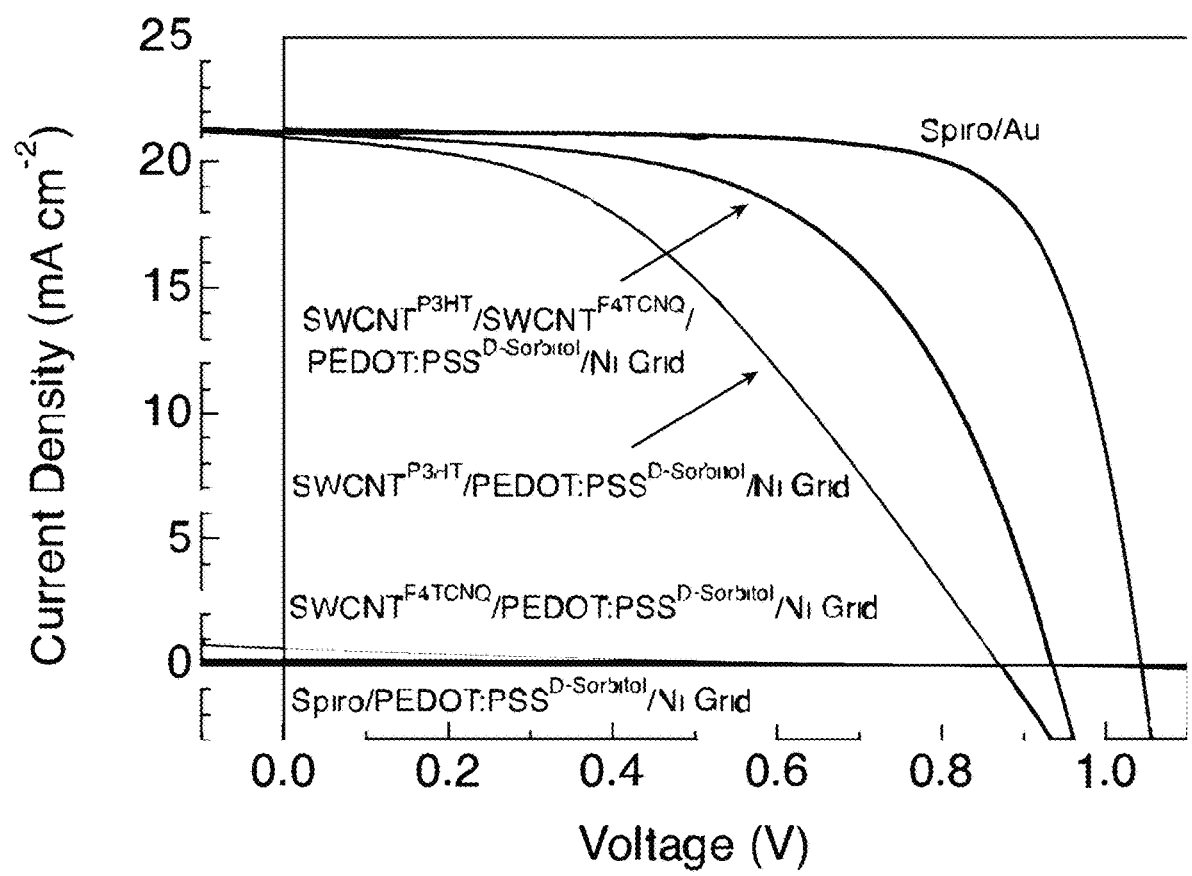
FIG. 11 illustrates a comparison of current-voltage characteristics for various device architectures, according to some embodiments of the present disclosure.

FIG. 8H shows the current density—voltage curve of the switchable PV device in the dark (dashed) and under 1-sun illumination (solid). The champion device exhibited a PCE of 11.3% with an average of 10.3±0.9% in five devices. A table with the performance metrics of the high-performing device are shown in the inset to FIG. 8H. For comparison, control devices were fabricated with the same MHP and electron contact layers but with Li-doped spiro-OMeTAD as the hole transport layer and gold as the top contact to mimic conventional MHP PV devices. The control devices, which do not switch since the gold contact is not permeable to CH$_3$NH$_2$ vapor, exhibited an average PCE of 16.3±0.1%. The short-circuit current density ($J_{SC}$) of 21.2 mA cm$^{-2}$ for the champion switchable device was identical to the control device, whereas deficits in the open-circuit voltage ($V_{OC}$) and fill factor (FF) characterize the switchable WIPV device compared to the control device. The SWCNT$^{F4TCNQ}$ layer significantly improves FF, which is only 0.34±0.06% for devices with the SWCNT/P3HT and not including the SWCNT$^{F4TCNQ}$ layer. The SWCNT/P3HT alone was too electrically resistive for transport to the nickel micromesh contacts. The SWCNT$^{F4TCNQ}$ layer significantly reduced the series resistance (see FIG. 11).

Figure 12A:
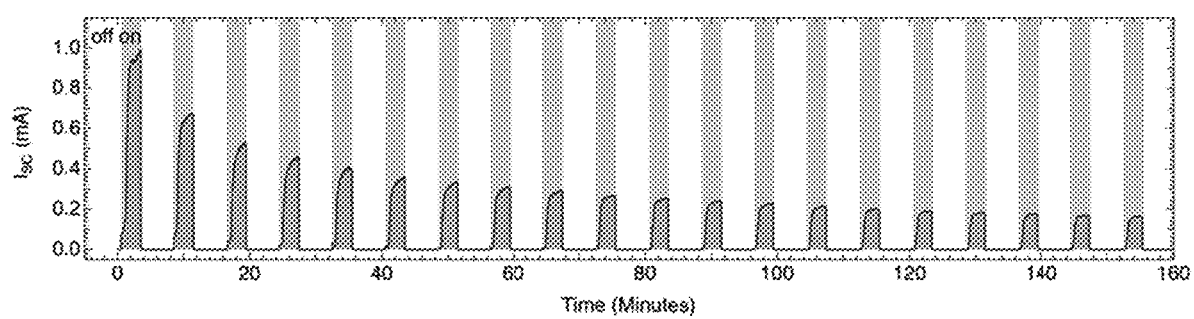
FIGS. 12A, 12B, and 12C illustrate the dynamic transmittance and power generation from switchable WIPV devices, according to some embodiments of the present disclosure.
Figure 12B:
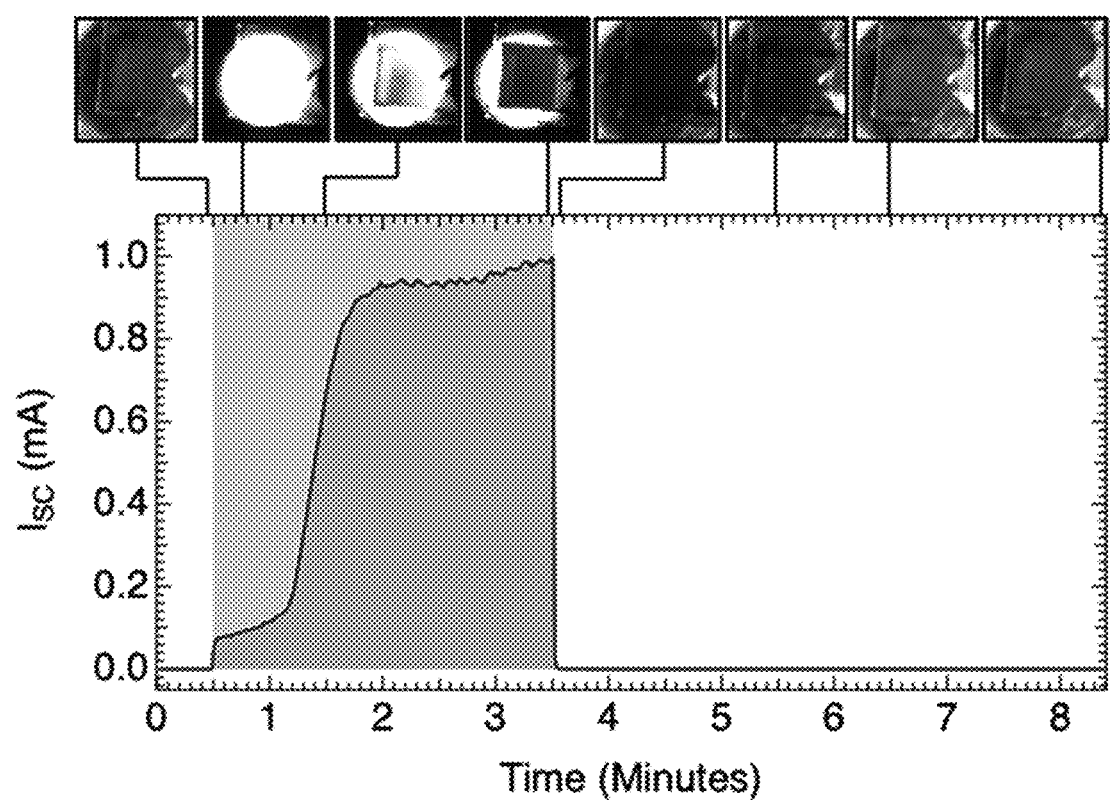
Figure 12C:
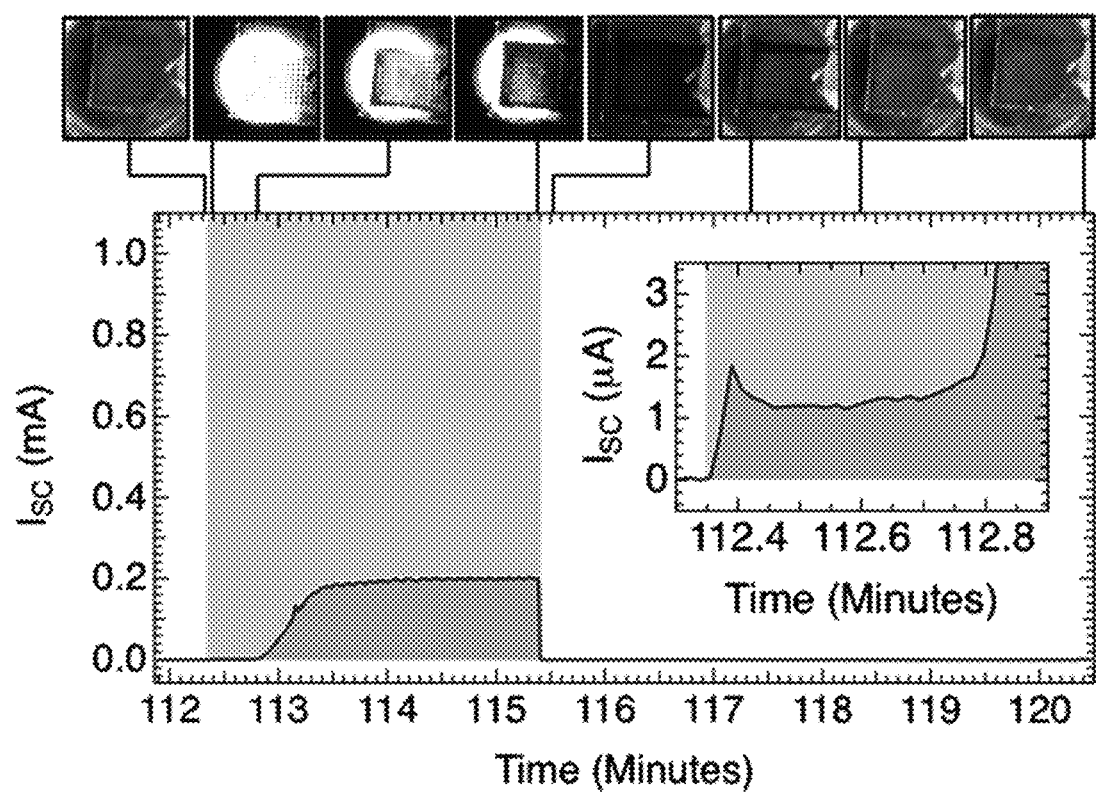

FIGS. 12A-12C show dynamic photothermal modulation of a WIPV device transmittance under 1-sun illumination while generating photocurrent. FIG. 12A is a plot of short-circuit current output as a function of time for a device enclosed in an atmosphere 5% CH$_3$NH$_2$ balanced with argon to atmospheric pressure. The device started in the intercalated (transparent) state at time zero until the device was exposed to 1-sun solar-simulated illumination at 30 seconds, indicated by gray boxes in FIG. 12A. Current was immediately observed from the device after illumination, which increased and started to plateau after 1 minute. The current dropped to zero when the lamp was turned off after three minutes. The lamp was turned back on after five minutes, and this cycle was repeated 20 times in a closed atmosphere (no additional CH$_3$NH$_2$) to demonstrate repeated cycling.

Reversible color change was achieved during each of these cycles, as demonstrated by still-frame images taken during the first and fifteenth cycles (see FIGS. 12B and 12C and inset of FIG. 12C). The current kinetics were similar in each cycle. The device immediately produced current when illuminated, but did not visibly exhibit color change. The current increased at a near-linear rate until 40 seconds of illumination when the current increased at a higher rate, which correlated to visible color change and complete switching after three minutes. When the lamp was turned off, the device cooled in the chamber, which caused CH$_3$NH$_2$ vapor to intercalate back into the MAPI and return the device to the transparent state after 3 minutes.

Maximum current decreased monotonically from nearly 1 mA to 0.18 mA after 20 cycles. The still-frame images in FIG. 12C suggest degradation of the MAPI layer, which show the device no longer had consistent coloration across the device as it did on the first cycle. Without wishing to be bound by theory, there are a number of explanations for this: (i) It is possible the MAPI layer does not re-form into the same uniform morphology as the original to yield a thinner, more transparent layer. (ii) Ions are known to migrate at elevated temperatures and react with other layers in the device. (iii) Decreased sublimation temperature has been observed previously for methylammonium halides when complexed to PbI$_2$, so components of MAPI may have been lost to the gas phase to yield PbI$_2$ in the layer. It should be possible to overcome imperfect irreversibility with additional engineering and understanding of the film intercalation/de-intercalation dynamics.

As described above, a device may include a transport layer having one more layers constructed of CNT, for example SWCNT. CNTs may be chosen to have a characteristic diameter, length, and/or chirality. For example, CNTs may have a diameter between 0.4 nm and 40 nm. CNTs may also have a characteristic diameter to length ratio as high as 1.3*10^8. A layer used to construct a transport layer may have a thickness between 5 nm and 500 nm. In addition, CNTs may be selected having one or more characteristic chiralities.

Materials and Methods:

PCE versus VLT calculations: The calculations shown in FIG. 4A were done with Mathematica code written by Steven Byrnes and modified to read in the absorption coefficient of an arbitrary absorber and calculate PCE as a function of solar photon energy. The absorption coefficient, α(E), of a MAPI single crystal was determined using ellipsometry and was used for calculations for different absorber layer thickness. An optical bandgap of 1.5 eV is used for the S-Q limit. Because we are evaluating a window technology, we assume one pass of light through the absorber to give the number of photons absorbed:

$$a(E,W) = \Gamma(E)(1-\exp[-\alpha(E)W])$$

where $\Gamma(E)$ is the AM1.5 solar spectrum, E is the solar photon energy, and W is the thickness of the absorber layer. The absorbance is used to calculate the current density from the device from the following equation:

$$J = e \int_{E_1}^{E_2} \left( a(E,W) - R_0(E,V)\exp\left[\frac{eV}{k_BT} - 1\right] \right) dE$$

where e is the elementary charge, $R_0$ is the radiative recombination rate at zero quantum Fermi level splitting, V is voltage, and $k_B$ is the Boltzmann constant. The PCE is then calculated from the maximum power point (i.e. where the product of J and V reaches a maximum).

Visible light transmittance is calculated from the following:

$$VLT = \int_{E_1}^{E_2} 1 - \frac{a(E,W)}{\Gamma(E)} dE$$

where visible light is defined by what the human eye can see, which is between $E_1$=1.65 eV and $E_2$=3.26 eV.

Crystal structures: Crystal structures in FIG. 4C were for illustrative purposes only, as the actual structure of the intercalated MAPI was not determined. The images were generated from a .cif file of hydrated MAPI ($CH_3NH_3PbI_3 \cdot H_2O$) using Jmol open-source software. Hydrogen is not shown.

Absorber layer solution: The solution used to solubilize MAPI precursors was obtained by charging acetonitrile with $CH_3NH_2$ gas. Acetonitrile was dried and de-gassed using three freeze-pump-thaw cycles and placed in an air-tight flask. $CH_3NH_2$ gas was flown into the vessel through a Schlenk-line assembly. The acetonitrile was charged until a 30% by volume $CH_3NH_2$ solution was achieved. The flask was sealed and stored in a −20° C. freezer. Solution was removed with needle through septum to keep the solution isolated from air exposure.

Figure 7:
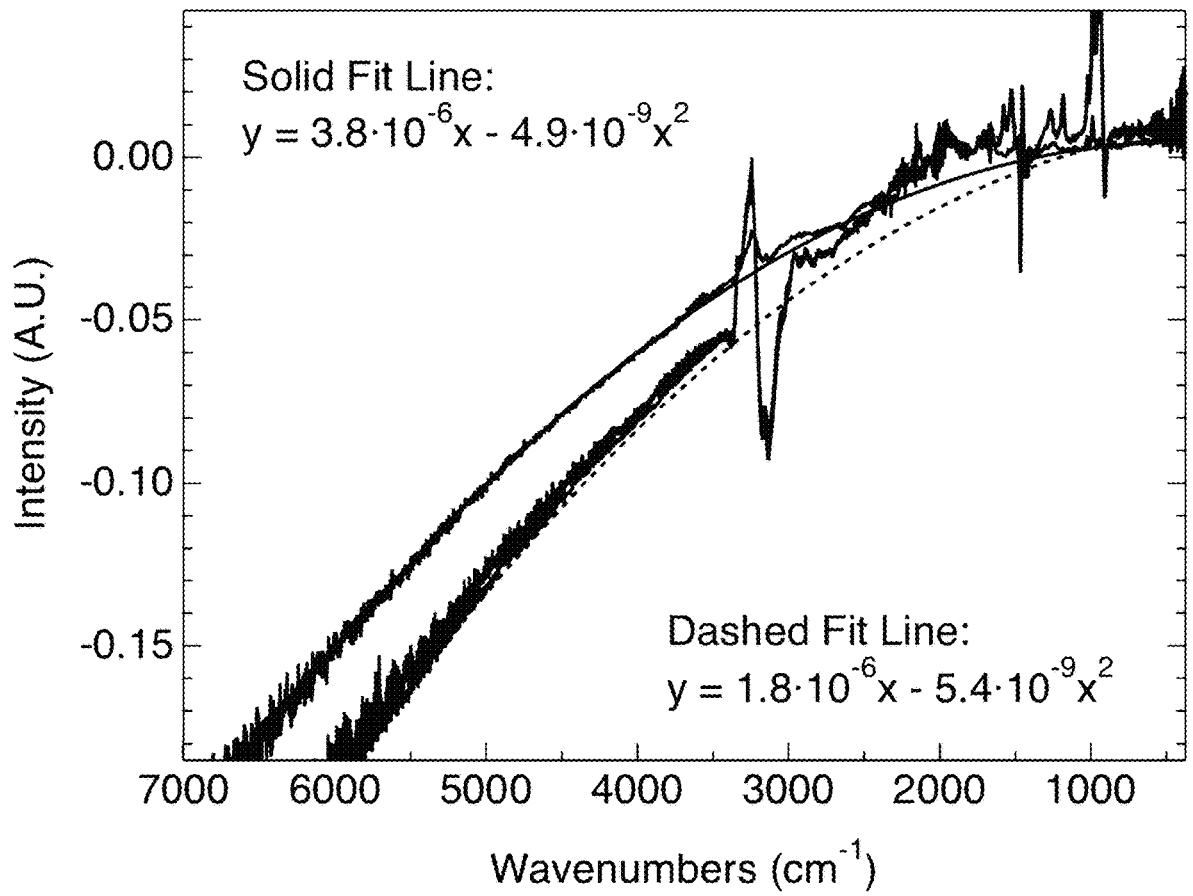
FIG. 7 illustrates background subtraction from FTIR data. The solid line is a $3^{rd}$ order polynomial fit to the data at 60° C. The dashed line is a $3^{rd}$ order polynomial fit to the data at 25° C. The fit parameters are shown in FIG. 7.

FTIR measurements: A Bruker Alpha FTIR spectrometer outfitted with a diamond ATR crystal attachment was used in the study. A MAPI film was deposited onto an ATR crystal by drop-casting a 0.055 M solution composed of methylammonium iodide and $PbI_2$ (5% excess) and the 30% $CH_3NH_2$ in acetonitrile solution. The film was annealed at 100° C. for 30 minutes. Securing a custom glass chamber over the ATR crystal stage with a Viton O-ring enclosed the film. Superglue was added to the O-ring/ATR stage interface to ensure the seal was maintained at atmospheric pressure. The film was pumped down with a roughing pump over night to obtain a base pressure of 68 mtorr. $CH_3NH_2$ was introduced into the glass jar at 20 torr, which bleached the MAPI film. The jar was balanced with argon to reach atmospheric pressure. The temperatures reported are those measured and delivered to the ATR stage with OPUS 7.2 software. Spectra shown at 60° C. were taken after the 3 minutes it took to ramp to that temperature. Spectra shown at 25° C. were taken after 21 minutes, which is the time took to cool to that temperature. The backgrounds of the resulting spectra were non-linear due to thin film diffraction due to change in the MAPI film thickness. The background was subtracted using a $3^{rd}$ order polynomial fit using IGOR Pro version 6.37. One fit was used to subtract the baseline at each temperature. The raw data and polynomial fits are shown in FIG. 7.

Photothermal switching of MAPI film: Glass was cut into a 1 inch×1 inch square, sonicated in acetone for 15 minutes, and blown dry with dry air. The substrates were treated in a UV-ozone cleaner for 15 minutes before spin-coating a 0.55 M solution composed of methylammonium iodide and $PbI_2$ (5% excess) and the 30% $CH_3NH_2$ in acetonitrile solution onto the substrate at 2000 rpm for 20 s. The film was annealed at 100° C. for 30 minutes on a hotplate. Photothermal switching of MAPI films was measured in a custom-built glass chamber outfitted with optical ports and feed-throughs for gas input/output and a pressure gauge. The glass substrate with MAPI film was secured in the chamber with a clip facing the optical port. The chamber is sealed with a Viton o-ring and clamp and pumped down over night to reach a base pressure of 40 mtorr measured with a Varian type 0531 vacuum gauge. 5% $CH_3NH_2$ partial pressure is introduced into the chamber and backfilled with argon to reach slight overpressure above atmospheric pressure (enough pressure to bubble Ar through 4 inches of mercury in a 1-inch tube). A Cole-Palmer Illuminator 41720-series is used for solar-simulated illumination. The lamp simulates 1-sun conditions by adjusting the intensity to 1000 W $m^{-2}$ using a Newport power meter (model 841-PE) with a model 818P-015-19 sensor head.

SWCNT/P3HT ink preparation: Powdered Powdered SWCNTs produced by the CoMoCAT process, SWeNT CG200, were purchased from Sigma-Aldrich. The producers of this material report a diameter range of 0.7-1.4 nm and a relative purity of 90% as the percentage of carbon that is present as SWNTs. rr-P3HT (3.0 mg, Rieke Metals Inc., weight-average molecular weight $M_w$=50000 g $mol^{-1}$, and regioregularity=95%) was dissolved in 5.00 mL of chlorobenzene and sonicated in a bath sonicator for 60 min. SWCNTs (2.5 mg) were added, as purchased, to the dissolved polymer solution and treated with a Cole Parmer 750 W ultrasonic probe, operating at 100% power, for 10 min. After sonication, 5 mL of chlorobenzene was added to improve the solubility of the polymer-nanotube hybrids. The mixture was subsequently centrifuged for 8 minutes at 10000 g (Beckman Coulter ultracentrifuge, SW32 rotor) to remove unfunctionalized SWCNTs and other carbonaceous particles. The precipitate was discarded, and the supernatant was recovered. 10 mL toluene was added in order to remove the excess polymer. The mixture was then mildly heated for 60 minutes to induce aggregation of the functionalized SWNTs. The aggregates were then removed by centrifugation (4 minutes at 16000 g). The supernatant containing excess polymer was discarded, and the precipitate was recovered. The pellet consisted of 1.5-1.6 mg of polymer-wrapped nanotubes, which were dispersed in 6 mL of chloroform. Immediately prior to spin-coating, the chloroform dispersion was sonicated with an ultrasonic probe for 1 minute at low intensity (~10% of amplitude) to break up clusters and bundles.

$SWCNT^{F4TCNQ}$ ink preparation: SWCNTs were synthesized in-house at NREL via laser vaporization of a graphite target at a furnace temperature of 1125° C. The imine-based dispersing polymer, poly[(9,9-di-n-dodecyl-2,7-fluorendiyl-dimethine)-(1,4-phenylene-dinitrilomethine)] (PFPD), was synthesized in-house using procedures known to one of ordinary skill in the art. To disperse the SWCNTs, 1.4 mg $mL^{-1}$ SWCNTs and 2 mg $mL^{-1}$ PFPD were added to toluene and processed using an ultrasonic probe for 15 min while the vial was submerged in a bath of dry ice and methanol. Following ultrasonication, the undispersed material is pelleted out via 5 min ultracentrifugation (13,200 rpm, 20° C.) using a Beckman Coulter SW32Ti motor. The supernatant was retained and underwent further ultracentrifugation (20 hr, 24,100 rpm, 0° C.) to remove excess PFPD. The resulting pellet, containing highly enriched semiconducting SWCNTs wrapped with PFPD (SWCNT/PDPD), was re-dispersed in neat toluene. The SWCNT/PDPD ink was doped in solution phase by adding 250 µg/mL using 2,3,5,6-Tetrafluoro-7,7,8,8-tetracyanoquinodimethane ($F_4TCNQ$). The bleach of the $S_{11}$ transition in the optical absorption spectrum of the ink after adding F4TCNQ indicates successful doping (see FIG. 9).

Device fabrication: Substrates with pre-patterned FTO deposited on glass were purchased from Thin Film Devices, Inc. The substrates were sonicated in acetone for 15 minutes and blown dry with dry air. The substrates were treated in a UV-ozone cleaner for 15 minutes before spin-coating a 0.15 M TAA solution in 1-butanol (TAA=titanium diisopropoxide bis(acetylacetonate, 75 wt % in 2-propanol, concentration of ~2 M) at 700 rpm for 10 s, followed by 1000 rpm for 10 s, and finally 2000 rpm for 30 s. The resulting film is placed on a hot plate at 125° C. for >2 minutes to drive off solvent and then placed in a 500° C. furnace to sinter into TiO$_2$. A 0.55 M solution composed of methylammonium iodide and PbI$_2$ (5% excess) and the 30% CH$_3$NH$_2$ in acetonitrile solution was spin-coated onto the substrate at 2000 rpm for 20 s in an inert atmosphere glovebox. The film was annealed at 100° C. for 30 minutes in the glovebox to yield a MAPI layer. The SWCNT/P3HT were deposited onto the MAPI layer by spinning the substrate at 3000 rpm and dropping 300 µL of the SWCNT/P3HT dispersion at a rate of ~1 drop every 3 seconds. SWCNT$^{F4TCNQ}$ thin films were deposited onto the WIPV using ultrasonic spray deposition. Briefly, MAPI films on TiO$_2$/glass substrates were heated to 130° C. on the stage in the spray chamber. Then, the SWCNT$^{F4TCNQ}$ ink was sprayed using a dispersion flow rate of 0.25 mL/min, gas flow rate of 7.0 std L/min, and nozzle power at 0.8 W for 30 coats. After deposition, the films were soaked at 80° C. in a solution of 10 µL/mL of trifluoroacetic acid (Sigma-Aldrich) in toluene for 30 seconds, followed by a rinse in neat toluene to fully remove the wrapping polymer, PFPD. Nickel micromesh composed of a square network of 14 µm×14 µm nickel bars with 268 µm×268 µm holes was purchased from Precision Eforming, Inc. A 2-inch×4-inch piece of mesh was attached to an aluminum plate using polyimide tape. The aluminum plate is attached to a hotplate with polyimide tape and set to 120° C. PEDOT:PSS (CLEV-IOS PH1000) was purchased from Heraeus. 3 mL of PEDOT:PSS was combined with 450 mg D-sorbitol and 136 µL dimethylsulfoxide and stirred with a magnetic stir bar for 15 minutes. The solution was sprayed onto the micromesh on the hotplate using an airbrush (Master Airbrush Model S68). The PEDOT layer is sprayed with 10 passes at a rate of ~1 inch s$^{-1}$ at a distance of 6 inches from the mesh with the airbrush throttle fully open. The PEDOT:PSS$^{D-Sorbitol}$ was annealed for 10 minutes after spraying and then cooled to room temperature before being cut into ~3 mm×11 mm strips. Transferring the strips with a tweezers to cover the active area and pressing with gentle finger pressure through a flexible Polyethylene terephthalate substrate completes the switchable PV device.

UV-vis-NIR measurements: Measurements were carried out on a Cary-6000i spectrometer with an integrating sphere attachment. Devices were scored and cracked to roughly 2 cm wide to fit into cuvettes. Silicone oil was placed on the back-side of the device to adhere it to the cuvette and avoid additional thin film interference. The cuvette was sealed with a septum, and the atmosphere was removed with a roughing pump through a needle. For the bleached state measurement, 5% CH$_3$NH$_2$ partial pressure was added to the cuvette and backfilled with argon. The cuvette was filled with argon for the colored state measurement.

Current-voltage measurements: Solar cell devices were measured under AM1.5 illumination in an inert atmosphere using a Newport solar simulator calibrated with a Si photodiode (Hamamtsu, S1787-04). An aperture of 0.06 cm$^2$ was used when measuring current-voltage curves.

Photocurrent measurement in switching device: Dynamic photoresponse of PV devices was measured in a custom-built glass chamber outfitted with optical ports, feedthroughs for gas input/output, electrical connection, and a pressure gauge. A PV device was secured in the chamber with a clip, and electrical connection to the device was made with alligator clips. The electrical connections are fed through the chamber to a Kiethley 2400 sourcemeter interfaced to a computer using Labtracer 2.0 software. The chamber is sealed with a Viton o-ring and clamp and pumped down over night to reach a base pressure of 40 mtorr measured with a Varian type 0531 vacuum gauge. 5% CH$_3$NH$_2$ partial pressure is introduced into the chamber and backfilled with argon to reach slight overpressure above atmospheric pressure (enough pressure to bubble Ar through 4 inches of mercury in a 1-inch tube). A Cole-Palmer Illuminator 41720-series is used for solar-simulated illumination. The lamp simulates 1-sun conditions by adjusting the intensity and monitoring the short-circuit current of the device until it matches the short-circuit current of the device measured in the calibrated Newport solar simulator.

EXAMPLES

Example 1

A device comprising: an active layer; and a first charge transport layer, wherein: the first charge transport layer comprises a first layer and a second layer, the first layer is in contact with the second layer, the second layer is positioned between the first layer and the active layer, the first layer comprises a first carbon nanostructure, and the second layer comprises a second carbon nanostructure.

Example 2

The device of Example 1, wherein the first carbon nanostructure comprises a first carbon nanotube (CNT).

Example 3

The device of Example 2, wherein the first CNT comprises a first single-walled carbon nanotube (SWCNT).

Example 4

The device of Example 3, wherein the first SWCNT has a diameter between 0.4 nm and 40 nm, inclusively.

Example 5

The device of Example 2, wherein the first CNT further comprises a dopant.

Example 6

The device of Example 5, wherein the dopant comprises at least one of triethyloxonium hexachloroantimonate, 2,3,5,6-tetrafluoro-7,7,8,8-tetracyanoquinodimethane (F$_4$TCNQ), a phosphine, an alkyl crown ether complex, an amine, nitrogen, or boron.

Example 7

The device of Example 6, wherein the dopant is F$_4$TCNQ.

Example 8

The device of Example 5, wherein the dopant is present at an atomic concentration between greater than 0% and 30%.

Example 9

The device of Example 5, wherein the dopant provides a carrier density greater than $1\times10^{17}$ per cubic centimeter.

Example 10

The device of Example 9, wherein the carrier density is between $1\times10^{19}$ and $1\times10^{21}$ per cubic centimeter.

Example 11

The device of Example 1, wherein the first layer has a thickness between one nanometer and 200 nm, inclusively.

Example 12

The device of Example 11, wherein the thickness is between 10 nm and 100 nm, inclusively.

Example 13

The device of Example 2, wherein the first CNT is at least partially semiconductive or partially metallic.

Example 14

The device of Example 13, wherein the first CNT is partially semiconductive and partially metallic.

Example 15

The device of Example 1, wherein the second carbon nanostructure comprises a second CNT.

Example 16

The device of Example 15, wherein the second CNT comprises a second SWCNT.

Example 17

The device of Example 16, wherein the second SWCNT has a diameter between 0.4 nm and 40 nm, inclusively.

Example 18

The device of Example 16, wherein the second SWCNT is not doped.

Example 19

The device of Example 16, wherein the second SWCNT further comprises a dopant providing a carrier density less than $1 \times 10^{17}$ per cubic centimeter.

Example 20

The device of Example 1, wherein: the first carbon nanostructure further comprises a polymer, and the first carbon nanostructure is at least partially coated by the polymer.

Example 21

The device of Example 1, wherein: the second carbon nanostructure further comprises a polymer, and the second carbon nanostructure is at least partially coated by the polymer.

Example 22

The device of Example 21, wherein the polymer comprises at least one of poly[(9,9-dioctylfluorenyl-2,7-diyl)-alt-co-(6,6'-{2,2'-bipyridine})], poly[(9,9-dihexylfluorenyl-2,7-diyl)-co-(9,10-anthracene)], poly(9,9-dioctylfluorenyl-2,7-diyl), poly[2-ureido-6 [1H]-pyrimidinone], poly[(9,9-di-n-dodecyl-2,7-fluorendiyl-dimethine)-(1,4-phenylene-dinitrilomethine)], or poly(3-hexylthiophene-2,5-diyl) (P3HT).

Example 23

The device of Example 22, wherein the polymer is P3HT.

Example 24

The device of Example 22, wherein the polymer is present at a mass ratio of the polymer to the second carbon nanostructure between 0.1:1 and 1:1, inclusively.

Example 25

The device of Example 1, wherein the second layer has a thickness between greater than one nanometer and 200 nm, inclusively.

Example 26

The device of Example 25, wherein the thickness is between 10 nm and 100 nm, inclusively.

Example 27

The device of Example 1, wherein the first layer and the second layer have a combined thickness between greater than 1 nanometer and 200 nm, inclusively.

Example 28

The device of Example 27, wherein the combined thickness is between 10 nm and 100 nm, inclusively.

Example 29

The device of Example 15, wherein the second CNT is at least partially semiconductive or partially metallic.

Example 30

The device of Example 29, wherein the second CNT is partially semiconductive and partially metallic.

Example 31

The device of Example 1, wherein the first layer and the second layer are permeable to an intercalating molecule.

Example 32

The device of Example 31, wherein the intercalating molecule comprises $CH_3NH_2$.

Example 33

The device of Example 1, wherein the first layer and the second layer are capable of transmitting light.

Example 34

The device of Example 1, wherein: the first carbon nanostructure comprises a first single-walled carbon nanotube (SWCNT) that is doped with 2,3,5,6-tetrafluoro-7,7,8,8-tetracyanoquinodimethane ($F_4TCNQ$), the $F_4TCNQ$ is present at an atomic concentration between greater than 0% and 30%, the second carbon nanostructure comprises a second SWCNT at least partially coated with poly(3-hexyl-thiophene-2,5-diyl) (P3HT), the P3HT is present at a mass ratio of the P3HT to the second SWCNT between 0.1:1 and 1:1, inclusively, and the first layer and the second layer have a combined thickness between 1 nanometer and 200 nanometers.

Example 35

The device of Example 1, wherein the active layer comprises at least one of an inorganic semiconductor material, an organic-inorganic semiconductor material, or an organic semiconductor material.

Example 36

The device of Example 35, wherein the inorganic semiconductor material comprises at least one of silicon, germanium, gallium, arsenic, cadmium, tellurium, lead, or sulfur.

Example 37

The device of Example 35, wherein the organic-inorganic semiconductor material comprises a perovskite.

Example 38

The device of Example 37, wherein the perovskite comprises methylammonium lead iodide.

Example 39

The device of Example 35, wherein the organic semiconductor material comprises at least one of polyacetylene, phthalocyanine, polyethylene terephthalate, poly(3,4-ethylenedioxythiophene), poly(3-methyl-thiophene), poly(3-hexylthiophene) a fullerene, or a fullerene derivative.

Example 40

The device of Example 1, further comprising a charge collecting layer, wherein the first layer is positioned between the second layer and the charge collecting layer.

Example 41

The device of Example 40, wherein the charge collecting layer comprises a metal.

Example 42

The device of Example 41, wherein the metal comprises nickel.

Example 43

The device of Example 41, wherein the metal is capable of transmitting light.

Example 44

The device of Example 41, wherein the metal is configured as a mesh having openings comprising a characteristic diameter of up to 300 nanometers.

Example 45

The device of Example 40, further comprising a layer of PEDOT:PSS$^{D\text{-}Sorbitol}$, wherein the PEDOT:PSS$^{D\text{-}Sorbitol}$ electrically connects the charge collecting layer to the first layer.

Example 46

The device of Example 1, further comprising a second charge transport layer, wherein the active layer is positioned between the second layer and the second charge transport layer.

Example 47

The device of Example 46, wherein the second charge transport layer comprises titanium dioxide.

Example 48

The device of Example 1, wherein the device is capable of transmitting visible light through the device.

Example 49

The device of Example 1, further comprising a reservoir containing an intercalating molecule, wherein the first charge transport layer is positioned between the active layer and the reservoir.

Example 50

A method for reversibly switching a window integrated photovoltaic device between a first state and a second state, the method comprising: a first reversible transferring of a molecule from a reservoir through at least a charge transport layer to an active layer; intercalating the molecule in the active layer; decalating the molecule from the active layer; and a second reversible transferring of the molecule through at least the charge transport layer to the reservoir, wherein: the first reversible transferring results in the first state, while in the first state, the active layer is substantially transparent to visible light, the second reversible transferring results in the second state, while in the second state, the active layer is substantially opaque to visible light, and while in the first state and the second state, the device is capable of converting at least a portion of light to electricity.

Example 51

The method of Example 50, wherein: the charge transport layer comprises a first layer and a second layer, the first layer is in contact with the second layer, the second layer is positioned between the first layer and the active layer, the first layer comprises a first carbon nanostructure, the second layer comprises a second carbon nanostructure, and the charge transport layer is positioned between the active layer and the reservoir.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A device comprising:
   a perovskite layer;
   a charge transport layer (CTL) comprising a first layer and a second layer;
   a metallic layer;
   a reservoir, and
   an intercalating molecule consisting of $CH_3NH_2$, wherein:
   the first layer comprises a first carbon nanostructure and a dopant,
   the second layer comprises a second carbon nanostructure,
   the first layer is positioned between the metallic layer and the second layer,
   the second layer is positioned between the first layer and the perovskite layer,
   the reservoir is positioned adjacent to the metallic layer,
   the reservoir is configured such that the intercalating molecule is capable of diffusing reversibly between the reservoir and the perovskite layer, and
   the CTL and the metallic layer are both configured to be permeable to the intercalating molecule.

2. The device of claim 1, wherein the first carbon nanostructure comprises a single-walled carbon nanotube (SWCNT).

3. The device of claim 2, wherein the SWCNT is at least partially semiconductive.

4. The device of claim 1, wherein the dopant is present at an atomic concentration between greater than 0% and 30%.

5. The device of claim 1, wherein the first layer has a thickness between one nanometer and 200 nm, inclusively.

6. The device of claim 1, wherein the second layer has a thickness between greater than one nanometer and 200 nm, inclusively.

7. The device of claim 1, wherein the metallic layer is a grid.

8. The device of claim 7, wherein the grid comprises a square network of bars having holes between the bars.

9. The device of claim 8, wherein the bars comprise nickel.

10. The device of claim 1, further comprising an electrically conductive polymer layer, wherein the electrically conductive polymer layer is positioned between the CTL and the metallic layer.

11. The device of claim 10, wherein the electrically conductive polymer layer comprises poly(3,4-ethylene dioxythiophene):poly(styrenesulfonate) (PEDOT).

12. The device of claim 1, wherein the dopant comprises 2,3,5,6-tetrafluoro-7,7,8,8-tetracyanoquinodimethane.

13. The device of claim 1, wherein the second layer further comprises a polymer comprising poly[(9,9-di-n-dodecyl-2,7-fluorendiyl-dimethine)-(1,4-phenylene-dinitrilomethine)].

14. The device of claim 13, wherein the second carbon nanostructure is at least partially coated by the polymer.

15. The device of claim 13, wherein the polymer further comprises at least one of poly[(9,9-dioctylfluorenyl-2,7-diyl)-alt-co-(6,6'-{2,2'-bipyridine})], poly[(9,9-dihexylfluorenyl-2,7-diyl)-co-(9,10-anthracene)], poly(9,9-dioctylfluorenyl-2,7-diyl), poly[2-ureido-6[1H]-pyrimidinone], or poly(3-hexylthiophene-2,5-diyl).

16. The device of claim 13, wherein the polymer is present at a mass ratio of the polymer to the second carbon nanostructure between 0.1:1 and 1:1, inclusively.

17. The device of claim 1, wherein:
   the perovskite is reversibly switchable between a transparent state and a tinted state,
   while in the transparent state, at least a portion of the intercalating molecule is positioned within the perovskite layer, and
   while in the tinted state, the perovskite layer is substantially free of the intercalating molecule.

18. The device of claim 17, wherein the perovskite is reversibly switchable in response to a change in at least one of a pressure change or an energy input.

19. The device of claim 18, wherein the energy input comprises at least one of a heat source, a radiation source, or an electrical bias.

20. The device of claim 18, wherein the energy input comprises a heat source configured to reversibly change the temperature of the perovskite layer between 25° C. temperature and about 60° C., corresponding to the transparent state and the tinted state, respectively.

21. The device of claim 18,
   wherein
   when in the tinted state, a substantial portion of the intercalating molecule is positioned within the reservoir.

22. The device of claim 21, wherein the reservoir comprises a space positioned adjacent to the metallic layer.

23. The device of claim 22, wherein the reservoir comprises a transparent chamber.

24. The device of claim 23, wherein the transparent chamber contains a gas comprising at least one of the intercalating molecule or an inert gas.

25. The device of claim 24, wherein the pressure change corresponds to reversibly switching the pressure in the reservoir between a minimum pressure less and a maximum pressure, corresponding to a tinted state and transparent state, respectively.

26. The device of claim 25, wherein the maximum pressure is between about 620 Torr and 1550 Torr.

27. The device of claim 25, wherein the minimum pressure is between $10^{-11}$ Torr and less than the maximum pressure.

* * * * *